United States Patent
Chen

(10) Patent No.: US 11,875,096 B2
(45) Date of Patent: Jan. 16, 2024

(54) MITIGATION OF BACKWARD WHIRL IN DRILL BITS

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 376 days.

(21) Appl. No.: 17/151,832

(22) Filed: Jan. 19, 2021

(65) Prior Publication Data

US 2022/0228438 A1     Jul. 21, 2022

(51) Int. Cl.
*G06F 30/20* (2020.01)
*E21B 3/035* (2006.01)
(Continued)

(52) U.S. Cl.
CPC .............. *G06F 30/20* (2020.01); *E21B 3/035* (2013.01); *E21B 10/14* (2013.01); *E21B 44/02* (2013.01)

(58) Field of Classification Search
CPC ...... G06F 30/20; G06F 30/17; G06F 11/3062; G06F 11/3409; G06F 11/3466;
(Continued)

(56) References Cited

U.S. PATENT DOCUMENTS 5,864,058 A * 1/1999 Chen .................. E21B 47/00
73/152.47

7,860,696 B2 * 12/2010 Chen .................. E21B 44/00
703/10
(Continued)

FOREIGN PATENT DOCUMENTS

WO        2020139341 A1    7/2020

OTHER PUBLICATIONS

Jain et al. "Mitigation of Torsional Stick-Slip Vibrations in Oil Well Drilling through PDC Bit Design: Putting Theories to the Test." Paper presented at the SPE Annual Technical Conference and Exhibition, Denver, Colorado, USA, Oct. 2011. 14 Pages. doi: https://doi.org/10.2118/146561-MS (Year: 2011).*
(Continued)

*Primary Examiner* — Eunhee Kim
(74) *Attorney, Agent, or Firm* — DeLizio, Peacock, Lewin & Guerra, LLP

(57) ABSTRACT

Design parameters for PDC drill bit are correlated to instances of backward whirl, where backward whirl is detected along a lateral axis in the frequency domain during downhole drilling. Two regimes of backward whirl are described and detected—cutting-induced backward whirl and friction-induced backward whirl—where each regime has different characteristic frequencies, detection methods, and mitigation guidelines. Design parameters are quantified by gauge fullness, drilling efficiency (DE), and whirl index (WI). Design guidelines to mitigate backward whirl are generated by correlating design parameter quantifiers and instances of backward whirl, including both cutting-induced backward whirl and friction-induced backward whirl. Potential drill bit designs are then validated against the generated guidelines in order to mitigate backward whirl in future drilling runs.

20 Claims, 13 Drawing Sheets

(51) Int. Cl.
*E21B 10/14* (2006.01)
*E21B 44/02* (2006.01)

(58) Field of Classification Search
CPC .... G06F 2201/865; E21B 3/035; E21B 10/14; E21B 44/02; E21B 10/43; Y02D 10/00
See application file for complete search history.

(56) References Cited

U.S. PATENT DOCUMENTS

| | | | |
|---|---|---|---|
| 9,926,779 B2 | 3/2018 | Sugiura | |
| 2007/0106487 A1* | 5/2007 | Gavia | E21B 10/54 703/7 |
| 2012/0152624 A1* | 6/2012 | Chen | E21B 10/43 175/428 |
| 2013/0248247 A1* | 9/2013 | Sugiura | E21B 44/00 702/9 |
| 2013/0248256 A1* | 9/2013 | Spencer | G06F 30/20 703/1 |
| 2014/0136168 A1* | 5/2014 | Spencer | G06F 30/20 703/2 |
| 2020/0386055 A1 | 12/2020 | Chen | |

OTHER PUBLICATIONS

Johnson, S. "A New Method of Producing Laterally Stable PDC Drill Bits." Paper presented at the IADC/SPE Drilling Conference, Miami, Florida, USA, Feb. 2006. 15 Pages. doi: https://doi.org/10.2118/98986-MS (Year: 2006).*

Chen, et al., "Identification and Mitigation of Friction- and Cutting Action-Induced Stick-Slip Vibrations with PDC Bits", Society of Petroleum Engineers, IADC/SPE International Drilling Conference and Exhibition, Mar. 3-5, 2020, Galveston, Texas, USA.

* cited by examiner

MITIGATION OF BACKWARD WHIRL IN DRILL BITS

BACKGROUND

The disclosure generally relates to earth drilling or mining and earth drilling, e.g., deep drilling, for obtaining oil, gas, water, soluble or meltable materials or a slurry of minerals from wells.

BACKGROUND

During drilling, drill bits and bottom hole assemblies experience axial, lateral, and torsional forces that can cause identifiable vibrational disfunctions. Backward whirl is a vibrational disfunction in which a drill bit, which rotates about an axis through the center of the drill bit, additionally rotates around a borehole in a direction opposite to the drill bit rotation. Forward whirl, in which the drill bit rotates around the borehole in the same direction as the drill bit angular rotation, is not as damaging or as common a vibrational disfunction as backward whirl. In backward whirl, the drill bit contacts the borehole wall in an interaction that can be percussive and damaging to both drilling apparatus and boreholes. Backward whirl can cause differential shock loading, such as when the drill bit or bottom hole assembly (BHA) momentum changes as a result of a collision with a borehole sidewall. Impacts and changes in tension throughout the drill string can result in distinctive mechanical failure and slow drilling rates.

Backward whirl results from coupling of vibrational modes along multiple axes, including about the drill bit axis and about the borehole axis. Vibrations along more than one axis of rotation or oscillation become linked or coupled harmonically or resonantly, producing backward whirl. Backward whirl occurs in two rotational frames of reference both about the rotational axis of the drill bit or BHA and about the center axis of the borehole. Backward whirl occurs as a function of the offset between the drill bit rotational axis and the borehole center. Backward whirl produces a characteristic multi-lobed pattern on the drilled formation face (i.e., a bottom hole pattern), which can serve to enlarge the borehole diameter and thereby self-propagate.

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to backward whirl in illustrative examples. Aspects of this disclosure can be also applied to forward whirl. In other instances, well-known instruction instances, protocols, structures, and techniques have not been shown in detail in order not to obfuscate the description.

Overview

Backward whirl is destructive to drill bits and BHAs and reduces the speed and efficiency of drilling. Instances of backward whirl are identified as a function of chill bit design, including as a function of drilling efficiency (DE), whirl index (WI) and gauge pad diameter or relief, from drilling runs where accelerometers and gyroscopes are used to measure axial, lateral, torsional, and rotational acceleration and angular momentum, respectively. Two different regimes of backward whirl can be identified based on vibrational characteristics: cutting-induced backward whirl and friction-induced backward whirl. Various parameters of the drill bit contribute to drilling efficiency (DE) and to whirl index (WI) which are used as a proxy to evaluate drill bit design for each identified backward whirl regime.

Using drill bit and gauge design parameters from a set of drilling runs, including runs in which backward whirl is identified, instances of backward whirl are correlated to drill bit design. Based on a relationship between drilling efficiency, whirl index, and gauge relief and the presence or absence of backward whirl, drill bit design criteria are chosen so that backward whirl of both types is minimized in subsequent drill bits or drilling runs. From the correlation, drill bit design guidelines or rules are generated which minimize the chances that a specific drill bit will experience backward whirl. Based on these guidelines, drill bit designs are validated or adjusted to minimize backward whirl in subsequent drilling runs.

Example Illustrations

Figure 1:
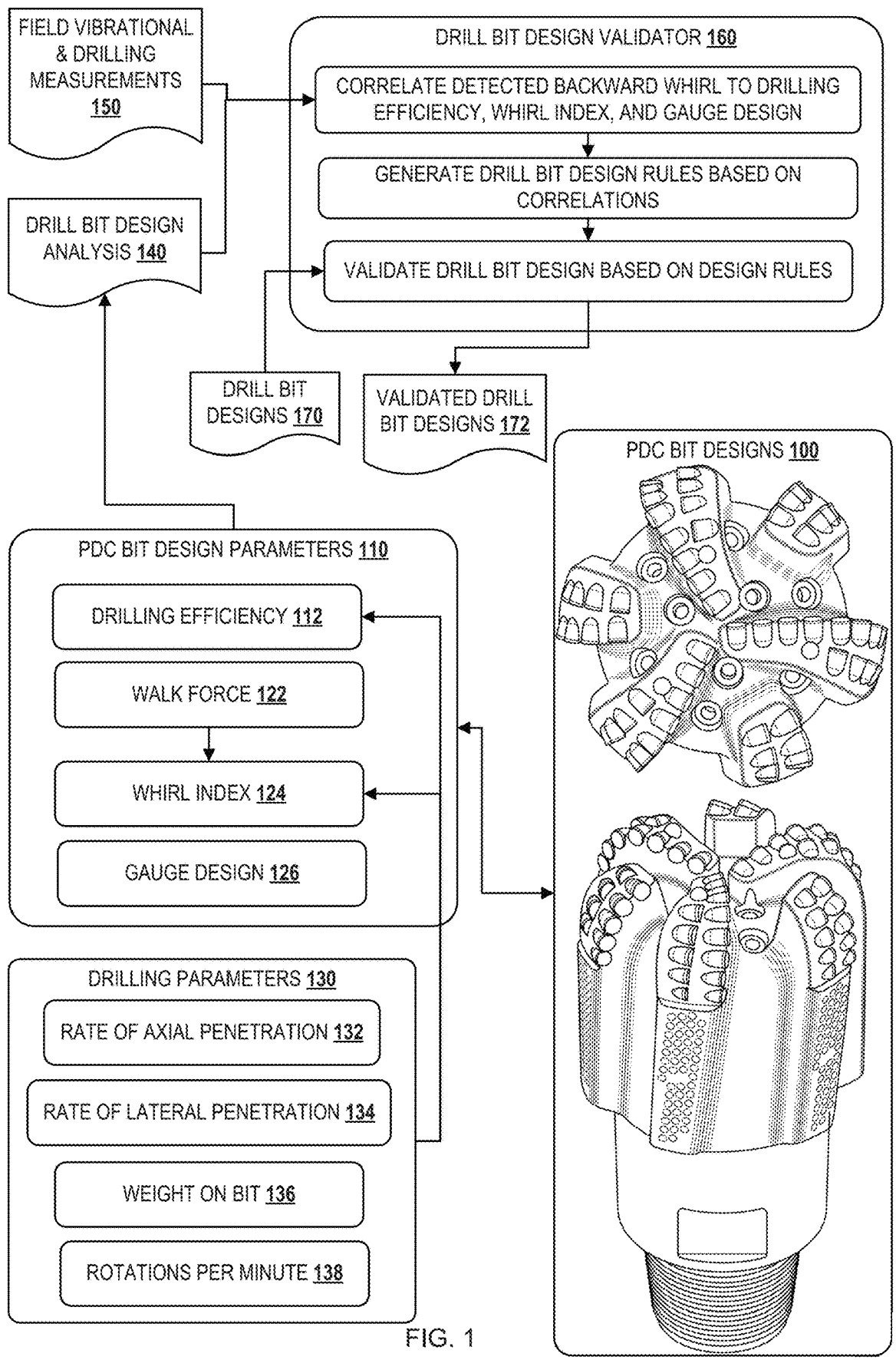
FIG. 1 illustrates an example system for correlating detected backward whirl and one or more drill bit design parameters in order to design drill bits with minimized or mitigated backward whirl.

FIG. 1 illustrates an example system for correlating detected backward whirl and one or more drill bit design parameters in order to design drill bits with minimized or mitigated backward whirl. The interaction between the drill bit and the rock can generate a bottom hole pattern which excites the bottom hole assembly (BHA) at a primary or harmonic frequency. The interaction between the drill bit or BHA and the borehole sidewalk can generate interactions which further excite the BHA at an additional rotational frequency about the center point of the borehole. Any non-linearity of the BHA or offset between the drill bit axis of rotation and the center point of the borehole can cause the primary rotation to spread across axes, creating coupled rotations across multiple axes. Rotation about both the drill bit axis and the center point of the borehole manifests as whirl, i.e., backward whirl or forward whirl. Backward whirl is both more common and more destructive than forward whirl. Therefore, considering backward whirl in bit design can extend the life of equipment. To address backward whirl in bit design, bit design parameters are determined. For each of the backward whirl regimes, drill bit design parameters of certain values or within certain ranges mitigate the likelihood that the drill bit axis and center point of the borehole are offset, reduce lateral offsetting forces, and reduce the strength of the drill bit and sidewall interactions.

As shown in FIG. 1, PDC bit designs 100 include the design of the cutting structure of the drill bit, and can include various control, hydraulic, and stabilization elements. PDC bit designs 100 are categorized by PDC hit design parameters 110, which include drilling efficiency (DE) 112, walk force 122, whirl index 124 and gauge design 126. The PDC bit design parameters 110 further include other drill bit quantities, qualities and dimensions, such as: bit dimensions; shape of bit profile; number of blades; number of cutters; type of cutters; back rake angle; side rake angle; primary cutter layout; backup cutter layout; number and location of depth of cut controllers (DOCCs) and DOCC design; gauge pad aggressiveness; gauge pad radius, width and length; gauge pad elements; etc. These additional drill bit quantities, qualities, and dimensions, which will be discussed in greater detail in reference to FIG. 2, contribute to the calculations of DE 112, walk force 122, whirl index 124, gauge design 126 and other global or comprehensive hit design parameters. DE 112, walk force 122, whirl index 124, and gauge design 126 can therefore be used as a proxy for the total drill bit design or for multiple drill bit quantities, qualities, and dimensions at once.

The PDC hit design parameters 110 influence the drilling efficiency (DE) 112. The drilling efficiency (DE) 112 is given by Equation 1, below:

$$DE = \frac{\sigma_{rock}}{E_s} * 100\% \qquad (1)$$

where $\sigma_{rock}$ is the rock compressive strength and $E_s$ is the mechanical specific energy as given in Equation 2, below. $E_s$ is given in pounds per square inch (psi) as:

$$E_s = \frac{WOB}{A} + \frac{120\pi * RPM * TOB}{A * ROP} \qquad (2)$$

where A (in square inches or in²) is the cross-sectional area of hole drilled by the drill bit, WOB is the weight on bit, TOB is torque on bit, ROP is rate of penetration, and RPM is revolutions per minute (rev/min) of the drill bit. DE as calculated using Eqns. 1 and 2 depends on both formation information, i.e., rock compressive strength, and on drilling parameters 130. Drilling parameters 130 comprise rate of axial penetration (ROP) 132, rate of lateral penetration (ROL) 134, weight on bit (WOB) 136 and rotations per minute (RPM) 138. Drilling parameters can also include torque on bit (TOB), depth of cut (DOC), etc. The drilling efficiency (DE) 112 and the whirl index (WI) 124 depend on drilling parameters 130.

The drilling efficiency (DE) 112 of a PDC bit can also be calculated theoretically from the PDC bit design parameters 110, where formation and drilling parameters are assumed or averaged, and can be therefore used as a proxy for the total design and its efficiency. The drilling efficiency (DE) 112 can also be calculated for different formation and drilling parameters and averaged to provide an average DE. Guidelines for drill bit design are generated by correlating the drilling efficiency (DE) 112 or others of the PDC bit design parameters 110 to occurrences of backward whirl. Some drill bit design parameters 110, such as gauge pad aggressiveness, gauge pad elements, etc., can be omitted from calculations of drilling efficiency (DE) 112, even if other gauge pad parameters, such as gauge pad fullness, are included in calculations of drilling efficiency (DE) 112.

The PDC bit design parameters 110 also influence the whirl index (WI) 124.

The whirl index (WI) 124 is given by Equation 3, below:

$$WI = \frac{dF_w/dROL}{dWOB/dROP} \qquad (3)$$

where WI is a whirl index of a bit, $F_w$ is the walk force of the bit, ROL is the rate of lateral penetration, WOB is the weight on bit, and ROP is the rate of axial penetration, $dF_w/dROL$ is the derivative of the walk force with respect to the lateral rate of penetration, and dWOB/dROP is the derivative of WOB with respect to the axial ROP. Bit walk force is a measurement of the force driving the bit around the borehole, where the walk force of a bit corresponds to the probability that the bit experiences whirling. Negative bit whirl index WI corresponds to backward whirl behavior. However, if the type of whirl is specified (i.e., all instances correspond to backward whirl), the absolute value of WI can be used. WI is negative for most PDC bits. WI index can be calculated experimentally, based on data from drilling runs, or from simulations of drill bit behavior.

Whirl occurs as a result of walk force of the bit, where the borehole diameter is larger than the bit which allows walk force to cause collisions between the bit and sidewalls of the borehole. Backward whirl is a result of a negative walk force, or a walk force occurring opposite to the direction of drill bit rotation about the drill bit axis. During drilling, the cutters of a drill bit experience engagement with one or more faces of a formation. Contact with a formation generates forces on each of the cutters—both lateral force (Fs), which can be thought of as a drag, and axial force (Fa). The cutter forces can be measured, modeled, or estimated from the vertical and lateral rates of penetration and a module, measurement, or calculation of the engagement of each cutter with the formation as the bit travels. Cutter forces can then be projected to the bit coordinate system and from the bit coordinate system, to the hole coordinate system.

A walk force 122, Fw, for the bit can be calculated in the hole coordinate system. When a lateral force, Fs, is applied to the bit along either of the x or y axis, the sum of the resultant cutter forces occurring along the orthogonal axis (i.e., projected along the y or x axis, respectively) is the bit walk force, as shown below:

$$F_w = \sum_1^n F_w^c \quad (4)$$

where $F_w$ is the bit walk force contributed by the cutter's side cutting action, and $F_w^c$ 1050 is the cutter walk force for each of n cutters (for simplicity, only cutters along two blades are shown). A positive bit walk force correlates with a positive bit whirl in the forward direction, while a negative bit walk force correlates with a negative bit whirl in the direction opposite to the angular rotation of the drill bit.

A walk torque, Mx, which occurs about the axis centered at origin Oh 1020 of the hole coordinate system (i.e., the center point of the borehole), can also be calculated for each cutter. The total walk torque on the bit is given by the equation below:

$$M_w = \sum_1^n M_w^c \quad (5)$$

where $M_w^c$ is the bit walk torque contribution for each of n cutters and $M_w$ is the total bit walk torque from the contributions of all cutters.

The whirl index (WI) 124 and walk force 122 of a PDC bit can also be calculated theoretically from the PDC bit design parameters 110, where formation and drilling parameters are assumed or averaged, and can be therefore used as a proxy for the total design and its efficiency. The whirl index (WI) 124 and walk force 122 can also be calculated for different formation and drilling parameters and averaged to provide an average WI and average walk force. Guidelines for drill bit design are generated by correlating the whirl index (124) or others of the PDC bit design parameters 110 to occurrences of backward whirl. Some drill bit design parameters 110, such as gauge pad aggressiveness, gauge pad elements, etc., can be omitted from calculations of whirl index (124) and walk force 122, even if other gauge pad parameters, such as gauge pad fullness, are included in calculations of whirl index (WI) 124 and walk force 122.

The gauge design 126 of a PDC bit measures the interaction of one or more gauge pads with the borehole sidewalls. Gauge pads can be full in diameter, where the diameter of the gauge pads is equal to the largest diameter of the drill bit. Gauge pads can be non-full in diameter, where the diameter of the gauge pads is less than the largest diameter of the drill bit. Gauge pads that are non-rills exhibit an undercut or curve where the relief of the gauge pads is recessed from the profile curve of the drill bit. Gauge pads that are full can be approximated as substantially in contact with the borehole walls, while gauge pads that are non-full are approximated as occasionally in contact with the borehole walls. Non-full gauge pads can be in lateral drilling and as stabilization elements in axial drilling. The gauge design 126 can also measure the total interaction between the borehole sidewall and then drill bit design. The interaction can be measured as a coefficient of drag, a contact area, etc.

The PDC bit design parameters 110, including drilling efficiency (DE) 112, walk force 122, whirl index (WI) 124, and gauge design 126, characterize the drill bit design and allow correlation between drill bit characteristics and drilling behavior. A drill bit design analysis 140 encompasses selected, known, or determined design parameters, including the PDC bit design parameters 110. To identify drill bit design characteristics that correlate to or mitigate backward whirl, the drill bit design analysis 140 is correlated to field vibrational and drilling measurements 150. The field vibrational and drilling measurements 150 include vibrational data generated by PDC drill bits with on-board vibrational measurement systems. Accelerometers and gyroscopes, in each of the three axes, are included in the drill bit design at the electrical connection where the drill bit joins a bottom hole assembly. Axial, lateral, and torsional vibrations are calculated from measured axial, lateral, and torsional displacement, where torsional vibrations represent irregularities in bit rotation or rotations per minute (RPM). From measurement of axial, lateral, and torsional movement (where movement includes at least one of displacement, velocity, and acceleration), a bit whirl frequency can be calculated, and backward whirl detected, as will be discussed further in reference to FIG. 3.

A drill bit design validator 160 correlates the drill bit design analysis 140 and the field vibrational and drilling measurements 150 in order to generate drill bit design guidelines to minimize backward whirl. The drill bit design validator 160 can operate on a set or batch of drill bit designs together with their corresponding field data, or can iteratively update or refine guidelines based on additional drill bit design and field vibrational data. Optionally, the drill bit validator 160 may update guidelines based on real time measurements of field vibrational and drilling measurements 150 and allow for adjustment of drilling parameters 130 to mitigate detected backward whirl. The drill bit design validator 160 correlates field vibrational and drilling measurements 150 to the drill bit design analysis 140 for the drill bit used during the field measurement. The drill bit design validator 160 analyzes the field vibrational and drilling measurements 150 to detect instances of backward whirl, PDC bit design parameters 110 are mapped to instances of backward whirl and instances where no backward whirl is detected. The drill bit design validator 160 can map detected instances of backward whirl to one or more PDC bit design parameter 110 and generate a multi-dimensional map of the drill bit design space where backward whirl is not detected or is not frequently detected. The drill bit design validator 160 generates design rules or guidelines based on the mapped correlations between PDC bit design parameters 110 and detected backward whirl.

The design rules or guidelines can be permissive or restrictive. Permissive design guidelines indicate various combinations of drill bit design parameters that encompass the drill bit design space where backward whirl is not detected or are not frequently detected. Restrictive design guidelines/rules indicate various combinations of drill bit design parameters that do not encompass the drill bit design space where backward whirl is not detected or is not frequently detected. Rules or guidelines may be based on one design parameter (e.g., gauge diameter of the gauge design 126), one design parameter that encompasses multiple design parameters or is a proxy for the total design (e.g., drilling efficiency (DE) 112, whirl index (WI) 124, etc.), or based on a relationship between two or more design parameters (e.g., number of blades and whirl index (WI) 124).

The drill bit design validator 160 validates drill bit designs based on the generated guidelines. Drill bit designs 170 include data for one or more drill bit. The drill bit designs 170 can encompass all parameters of the drill bit design including the PDC bit design parameters 110 or can include a subset of the PDC bit design parameters 110. The drill bit design validator 160 compares the drill bit designs 170 to the generated guidelines. The drill bit design validator 160 selects or outputs a subset of the drill bit designs 170 as validated drill bit designs 172. The validated drill bit designs 172 are those of the drill bit designs 170 that satisfy or conform to the generated design rules or guidelines for mitigated backward whirl. Optionally, the drill bit design validator 160 can adjust one or more of the PDC bit design parameters 110 of one or more of the drill bit designs 170 so that the one or more drill bit designs comply with the design rules. The validated drill bit designs 172 can contain additional drill bit designs that are adjusted versions of one or more of the drill bit designs 170.

Drill bit designs, such as those validated by the drill bit design validator 160, are then produced as drill bits. Drill hits, including PDC drill bits are often formed with a bit body having cutting elements or inserts disposed at select locations on the exterior portion or surface of the drill bit. Fluid flow passageways are formed in the bit body to allow communication of drilling fluids from associated surface drilling equipment through a drill string or drill pipe and out of the drill bit, where such fluid can remove drilling cuttings, reduce friction, dissipate heat, etc.

Fixed cutter drill bits generally include a metal shank for engagement with the drill string or drill pipe, Various types of steel alloys may be used to form a metal shank. A bit head can be attached to an associated shank to forma a resultant bit body. Various attachment schemes can be used to attach the metal shank to the drill string or drill pipe.

For some applications, a bit head may be formed from various types of steel alloys satisfactory for use in drilling a borehole where the resultant bit body is a "steel bit body." For other applications, a bit head may be formed by molding hard, refractory material with a metal blank. A steel shank may be attached to the metal blank. The resulting bit body may be described as a "matrix bit body." Drill bits with matrix bit bodies can be described as "matrix drill bits."

Matrix drill bits are often formed by placing loose infiltration material or matrix material (sometimes referred to as "matrix powder") into a mold and infiltrating the matrix material with a binder such as a copper or other metallic alloy. Infiltration material can also include various refractory materials. A pre-formed metal blank or bit blank can be placed in the mold to provide reinforcement for a resulting matrix bit head. The mold can be formed by milling a block of material such as graphite to define a mold cavity with features corresponding generally with desired exterior features of a resulting matrix drill bit.

Various features of a resulting matrix drill bit such as blades, cutter pockets, fluid flow passageways, etc., may be provided by at least one of shaping of the mold cavity and positioning temporary displacement materials within interior portions of the mold cavity. An associated metal shank may be attached to the bit blank after the matrix bit head has been removed from the mold. The metal shank may be used to attach the resulting matrix drill bit with a drill string or drill pipe.

Three-dimensional (3D) printing equipment and techniques may be used in combination with three-dimensional (3D) design data, where drill bit designs are 3D design data, to form molds for producing drill bits, including matrix drill bits. For some applications, one or more of refractory materials, infiltration materials and matrix materials—typically in powder form—may be placed in such molds. For other applications, molten steel alloys or other molten metal allows may be poured into such molds. Heat transfer characteristics of such molds may be optimized for both heating and cooling of matrix materials or cooling of molten metal alloys to provide one or more of optimum fracture resistance (i.e., toughness); optimum tensile strength; optimum erosion, abrasion, or wear resistance; etc.

Combining characteristics of a 3D printer with 3D design data can allow greater freedom to design molds having mold cavities with complex configurations and dimensions as compared to conventional mold forming techniques. Drill bit designs can be modeled in 3D or transferred into 3D data programs and various drill bit design parameters can be measured or calculated. Drill bit designs validated by the drill bit design validator 160 (or adjusted by the drill bit design validator 160) can then be created, manufactured, or assembled as drill bits, through the generation of 3D-printed or other molds. Such molds are generated according to the parameters of the validated drill bit designs. Validated drill bit designs can alternatively be turned into drill bits through any other drill bit manufacturing process, where those drill bits eliminate or mitigate backward whirl.

Figure 2:
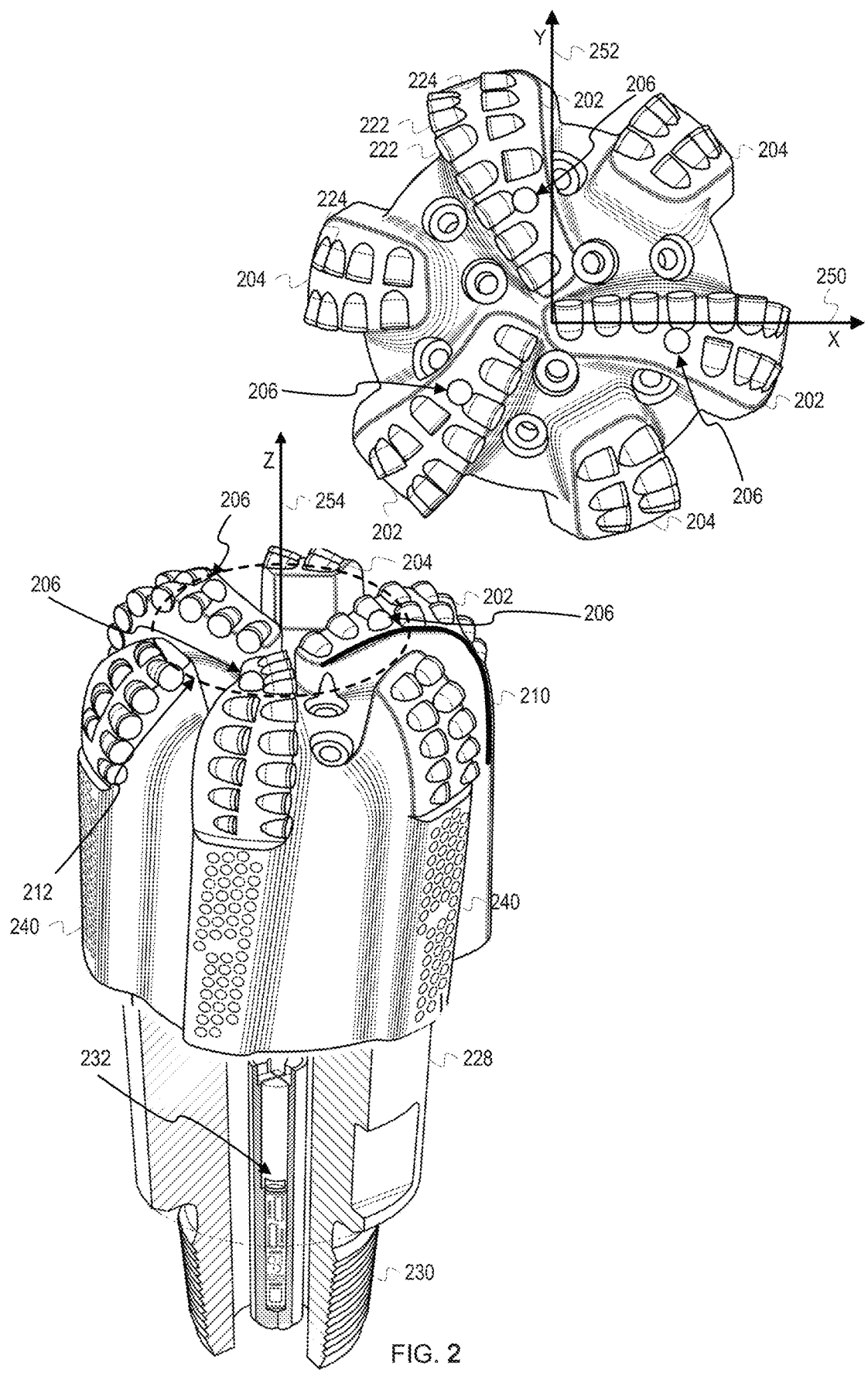
FIG. 2 depicts an example polycrystalline diamond compact (PDC) drill bit with accelerometers and gyroscopes for vibrational disfunction detection.

FIG. 2 depicts an example polycrystalline diamond compact (PDC) drill bit with accelerometers and gyroscopes for vibrational disfunction detection. The example PDC drill bit design includes primary blades 202, secondary blades 204, depth of cut controllers (DOCCs) 206, primary cutters 222, backup cutters 224, gauge pads 240, a shank 228, and a pin connection 230. A cone 212 is defined where the drill bit profile 210 curves inward towards the center of the drill bit. The pin connection 230 can be a connector according to any of the specifications of the American Petroleum Institute (API), including an API Specification 7 pin connection, or another equivalent connection type.

An embedded vibrational measurement device 232 comprises circuitry placed within the PDC drill bit, including inside any combination of the shank 228 and the pin connection 230, that measures drill bit vibration. Drill bit vibration can be measured as a function of location (or displacement), velocity, or acceleration (including radial velocity and radial acceleration) by accelerometers and gyroscopes within the vibrational measurement device 232. Drill bit vibration occurs along axial, lateral, and torsional axes. Axial, lateral, and torsional axes are defined with respect to direction of drilling, or optionally with respect to the borehole as shown in FIG. 1 and constitute a cylindrical coordinate system. The drill bit can also be described by x-axis 250, y-axis 252, and z-axis 254 in a Cartesian coordinate system. Axial vibrations are detected as changes in at least one of displacement, velocity, or acceleration substantially along the z-axis 254. Lateral and torsional vibrations are detected as changes in at least one of displacement, velocity, or acceleration substantially along the x-axis 250 and the y-axis 252, including exclusively in one axis or in any combination of the two axes. Additionally, a zero point or pole for either system of axis can be chosen with respect to the drill bit, the drill string, the borehole, the formation, etc.

Vibrational measurements are stored in memory at the PDC bit, where the memory can be located at any point in the bit or BHA or in the vibrational measurement device 232. Vibrational measurements can be retrieved from the vibrational measurement device 232 and logged when the BHA is returned to the surface. Optionally, vibrational measurements may be transmitted to another portion of the BHA for storage, transmitted to another portion of the BHA for transmission to a computer at the surface, or transmitted to a computer at the surface or a drilling controller for real-time analysis of vibrational data. The vibrational measurement device 232 can further contain a processor, controller, or other memory and software within its circuitry to store and operate vibrational behavior analysis.

Figure 3:
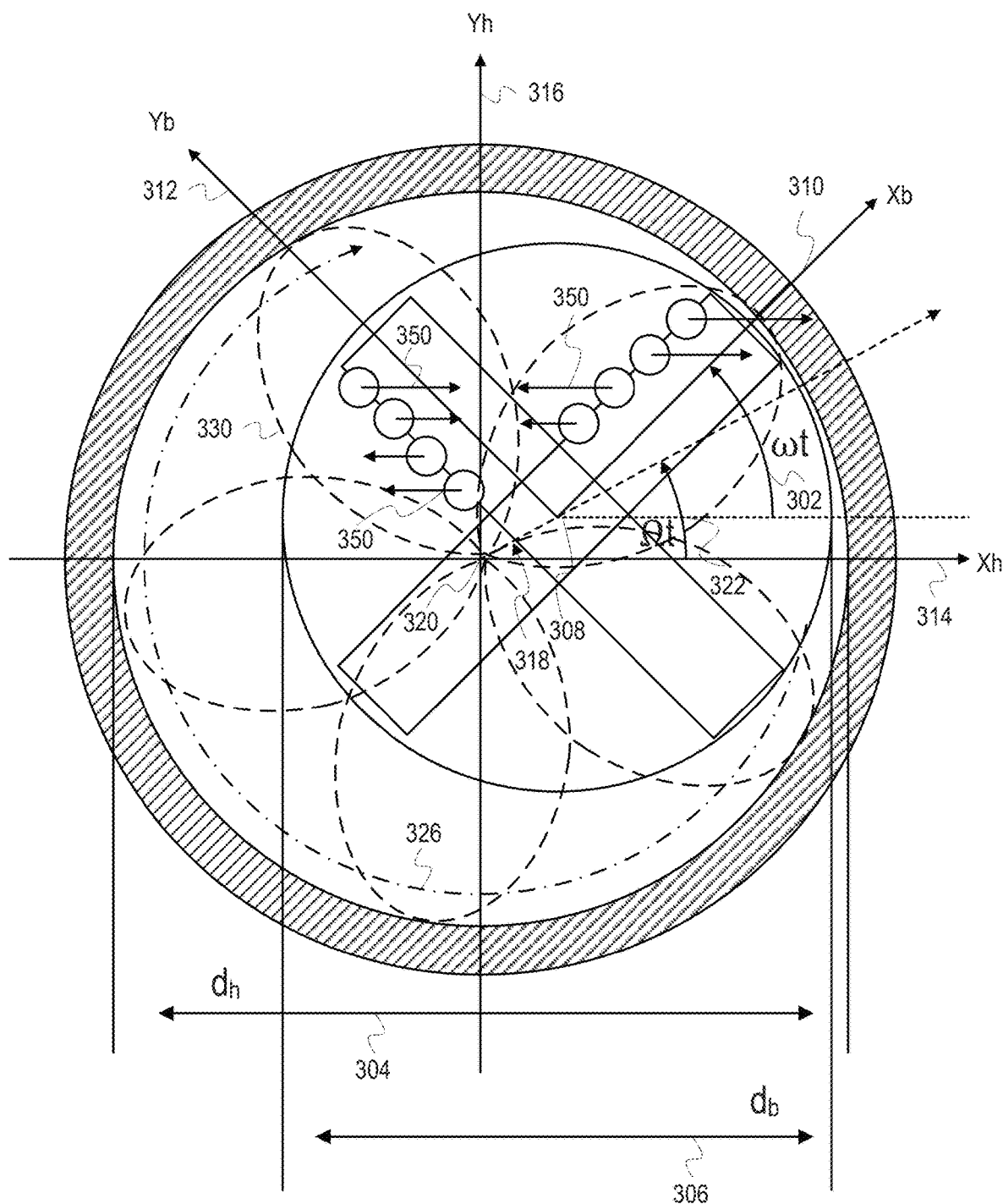
FIG. 3 illustrates calculations of bit whirl radius and frequency and identification of types of backward whirl.

FIG. 3 illustrates calculations of bit whirl radius and frequency and identification of types of backward whirl. Backward whirl behaviors can arise in drilling due to different mechanisms which induce walk forces and enlarge the borehole. Friction-induced backward whirl is caused by friction introduced by the interaction of the drill bit and the borehole sidewalls, while cutting-induced backward whirl is caused by interactions of cutting elements of the drill bit and one or more formation face. Backward whirl types can be identified and distinguished via calculations of whirl frequency from measured lateral and rotational movements of the drill bit or BHA.

Whirl frequency can be estimated in using calculation of a bottom hole assembly whirl frequency or a bit whirl frequency. Whirl frequency for a bottom hole assembly (BHA) can be calculated from a bit rotational frequency $\omega_b$ (shown as angular frequency $\omega$ 302) and a slip related dimensionless constant, k, as shown below:

$$\Omega_{bha} = -k\omega_b \frac{d_h}{(d_h - d_b)} \quad (6)$$

where $d_h$ is the hole diameter 304, $d_b$ is the BHA or bit diameter 306, and where k≤1.

Alternatively, an experimentally determined relationship between the number of blades of a PDC bit, and the number of lobes of a backward whirl pattern is shown below:

$$M = jN_b + 1 \quad (7)$$

where M is the number of lobes and where the number of lobes is a measure of a relationship between bit whirl frequency and the bit rotational frequency. M is the number of times the bit contacts, hits, or bounces off the borehole wall in each bit revolution.

Further, is an integer and j≥1, and $N_b$ is the number of blades of the PDC bit. Lower values of j correspond to higher backward whirl—e.g. j=1 or j=2 correspond to severe backward whirl. The bit whirl frequency $\Omega_{bit}$ is therefore given by $$\Omega_{bit} = \omega_b(jN_b+1) \quad (8)$$

where in most cases j=1. A 5 lobed backward whirl patter 330 is shown for the example 4 blade PDC bit pictogram of FIG. 3, where j=1. The most severe backward whirl corresponds to low values of the integer j (where j=1 is essentially the base frequency of the backward whirl harmonics) because as j increases the backward whirl patter more closely approximates regular bit rotation. If the bit experiences more collisions with borehole sidewalls, each collision is closer together, lateral acceleration between collisions is smaller, and less momentum is transferred between the drill bit or BHA and the sidewall. As j increases, backward whirl can become less damaging and as j approaches ∞ backward whirl behavior approximates that of normal drilling where differences between the axis of rotation of the bit and the center axis of the borehole appear as vibrational noise.

Calculation of bit whirl index, bit radius, and bit frequency are based on the relationship between the angular rotation of the bit about its center point or origin Ob 308 of the bit coordinate system $(X_b, Y_b)$ along the $X_b$ direction 310 and the $Y_b$ direction 312 and further angular rotation about the center point of origin Oh 320 of the bit coordinate system $(X_h, Y_b)$ along the $X_h$ direction 314 and the $Y_b$ direction 316. A whirl radius ΔR 318 is the difference in location between the origin Ob 308 of the bit coordinate system and the origin $O_h$ 320 of the hole coordinate system.

For any point A on bit axis $X_b$, the coordinates of point A on the hole coordinate system $(X_h, Y_h)$ along the $X_h$ direction 314 and the $Y_h$ direction 316 as shown below, where $R_a$ is the distance from $O_b$ to the point A and ΔR is the whirl radius 318:

$$X_h = \Delta R \cos(\Omega t) + R_a \cos(\omega t) \quad (9)$$

$$Y_h = \Delta R \sin(\Omega t) + R_a \sin(\omega t) \quad (10)$$

where ω 302 is the angular frequency point A experiences as a result of the bit rotation about the origin $O_b$ 308 of the bit coordinate system and Ω 322 is the angular frequency point A experiences as a result of bit rotation about the origin $O_h$ 320 of the hole coordinate system, which is whirl. Backward whirl direction 326 is shown pointing in the opposite of bit angular frequency 302.

Acceleration for the point A in the hole coordinate system is then given by:

$$X_a^h = -\Delta R \Omega^2 \cos(\Omega t) - R_a \omega^2 \cos(\omega t) \quad (11)$$

$$Y_a^h = -\Delta R \Omega^2 \sin(\Omega t) - R_a \omega^2 \sin(\omega t) \quad (12)$$

where acceleration is the second derivative with respect to time of position and the position of the point A is given by Eq. 9 and 10.

Acceleration in bit coordinate system is given by the projection of the acceleration in the hole coordinate system (from Eq. 11 and 12) onto the bit coordinate system, as shown below:

$$X_a^b = -\Delta R \Omega^2 \cos([\omega-\Omega]t) - R_a \omega^2 \quad (13)$$

$$Y_a^b = \Delta R \Omega^2 \sin([\omega-\Omega]t) \quad (14)$$

The accelerations measured by the on-bit sensors, which are located at the bit center at approximately the origin Ob 308 of the bit coordinate system are therefore given by:

$$X_a^b = \Delta R \Omega^2 \cos([\omega-\Omega]t) \quad (15)$$

$$Y_a^b = \Delta R \Omega^2 \sin([\omega-\Omega]t) \quad (16)$$

where at the origin $R_a = 0$.

The unwrapped phase angle is given by:

$$\varphi(t) = \arctan\left(\frac{Y_a^b}{X_a^b}\right) + \varphi_0 = -[\omega - \Omega]t \quad (17)$$

where the unwrapped phase angle is the instantaneous phase mapped to a continuous function over time.

The slope of the unwrapped phase angle is then given by:

$$\frac{d\varphi(t)}{dt} = -[\omega - \Omega] \quad (18)$$

Where the slope of the unwrapped phase angle is the instantaneous angular frequency.

The whirl radius is calculated as:

$$\Delta R = \frac{A_b}{\Omega^2} \quad (19)$$

where $A_b$ is the measured acceleration amplitude at point A, Ω 322 is the angular frequency point A experiences as a result of bit rotation about the origin $O_h$ 320 of the hole coordinate system, and ΔR is the whirl radius 318. The whirl radius ΔR can therefore be calculated from Ω 322 and knowledge about the location of a gyroscope or accelerometer with respect to the bit coordinate system.

The difference between the diameter of the borehole and the diameter of the drill bit can be calculated based on the whirl radius, where the maximum whirl radius is related to the borehole radius $r_h=½d_h$ and the drill bit radius $r_b=½d_b$. A whirl radius calculated from a point A located at the center of the drill bit is given by Eq. 20, below:

$$r_h=½d_h=\Delta R_{max}r_b=\Delta R_{max}+½d_b \quad (20)$$

where $\Delta R_{max}$ is the maximum whirl radius measured from the drill bit origin point. The relationship between the maximum whirl radius therefore simplifies Eq. 21, below.

$$\Delta R_{max}=½(d_h-d_b) \quad (21)$$

For a whirl radius measured at a point A located at a distance $A_b$ from the origin, Eq. 21 becomes Eq. 22, below:

$$\overline{\Delta R_{max}}=½(d_h-d_b) \quad (22)$$

where $\overline{\Delta R_{max}}$ represents an average of $\Delta R_{max}$ occurring at the whirl frequency Ω.

The bit rotational frequency, $\omega_b$, or ω 302, is measured by on-bit gyroscopes. If the slope of the phase angle can be obtained using Eq. 17, above, the whirl frequency Ω and the whirl radius ΔR 318 are obtained using Eqs. 17, 18, and 19. Moving averages can be applied to measurements of ($X_a^b$, $Y_a^b$) and φ(t) to reduce noise in the signals. Additionally, whirl frequency Ω is also obtained from a frequency spectrum of either $X_a^b$ or $Y_a^b$, where the frequency [ω−Ω] is dominant in these signals if whirl is occurring.

Whirl frequency Ω can be calculated using Eq. 18 (in the time domain) and/or using the frequency domain spectrum (i.e., by an FFT of $X_a^b$ or $Y_a^b$). These calculated whirl frequencies Ω can be compared to confirm the occurrence of bit whirl. A bit can vibrate laterally without whirl, which can produce a measurable bit whirl frequency Ω in the frequency domain of lateral signals that should not match a whirl frequency Ω calculated in the time domain based on the rotational acceleration. Alternatively, substantially similar calculated whirl frequencies Ω from both methods can confirm the presence of bit whirl.

Further, the frequency at which bit whirl is detected can be used to determine if it is friction-induced or cutting-induced. A whirl frequency which satisfies Eq. 6 corresponds to friction-induced backward whirl. A whirl frequency which satisfied Eq. 8 (usually for j=1 or j=2) corresponds to cutting-induced backward whirl. The identification of two regimes in backward whirl allows for further identification of the causes of backward whirl and, therefore, mitigation of such backward whirl.

Figure 4:
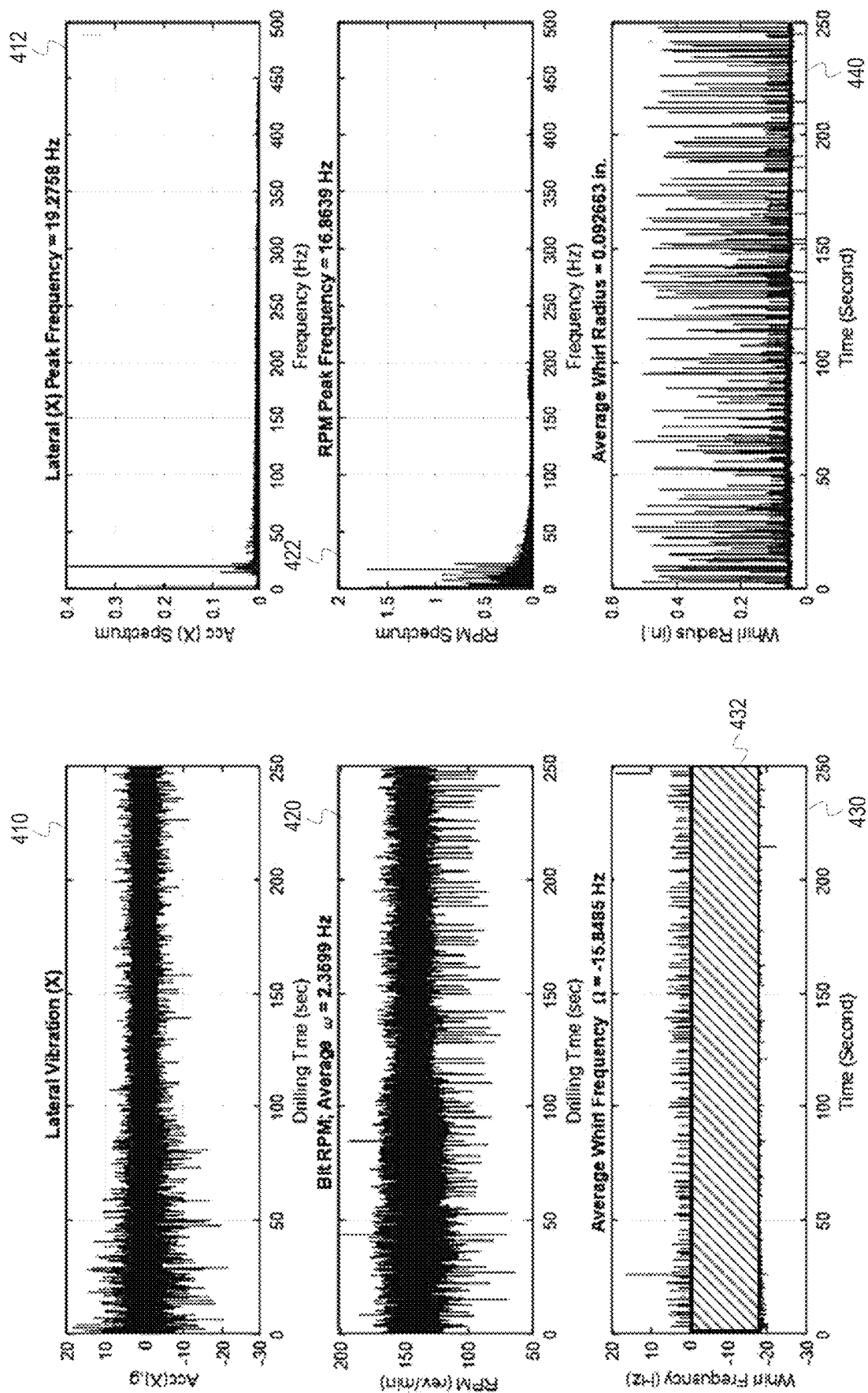
FIG. 4 depicts graphs corresponding to an example of cutting-induced backward whirl measured during drilling.

FIG. 4 depicts graphs corresponding to an example of cutting-induced backward whirl measured during drilling. FIG. 4 displays measurements corresponding to backward whirl for an 8¾" bit with six blades. Graph 410 depicts lateral acceleration in units of the gravitational acceleration constant (g or 9.80665 meters per second squared (m/s²)) as a function of time. The graph 410 displays lateral acceleration with a mean slightly above zero (i.e., 0 g) and with approximately equal positive and negative variation from the mean. The maximum lateral acceleration is approximately 10 g, while the minimum lateral acceleration is approximately −20 g. The majority of the variation in lateral acceleration falls between 10 g and −10 g. The graph displays more variation in lateral acceleration between 0 and 80 seconds (sec) of drilling time than during 100 to 150 sec of drilling time, but the mean lateral acceleration is approximately constant from 0 to 150 sec of drilling time. Graph 412 corresponds to a frequency spectrum of the lateral acceleration data displayed in the graph 410. In this example, the data of the graph 412 represents a fast Fourier transform (FFT) of the data of the graph 410. The frequency components of the lateral acceleration correspond to (ω−Ω) as calculated by Eq. 18. The graph 412 displays a global maximum at a frequency of 19.2758 Hertz (Hz). Frequency components below 50 Hz contribute more to the lateral acceleration than those above 70 Hz. The global maximum at ~19 Hz is surrounded by multiple smaller satellite peaks between 10 and 40 Hz which also contribute significantly to the lateral acceleration, albeit with at a strength of less than a quarter of the peak at 19.2758 Hz.

Graph 420 depicts revolutions per minutes (RPM), e.g., angular rotation speed of the drill bit about the drill bit axis, as a function of time. The data of the graph 420 corresponds to an average drill bit angular frequency of 2.3599 Hz (i.e., ω=2.3599 Hz) The average RPM is about 150 revolutions per minute (rev/min) and shows greater dispersion towards lower values than higher values. The minimum RPM is approximately 70 rev/min, while the maximum RPM is approximately 200 RPM. Graph 422 corresponds a frequency spectrum of the drill bit angular frequency or RPM data displayed in the graph 420. The graph 422 displays a global maximum at a frequency of 16.8639 Hz. This agrees with the whirl frequency calculated by using the measurements of (ω−Ω) from the graph 412 and measurement of ω from the graph 420. Based on the graph 412, the expected value of whirl frequency would be Ω=2.3599 Hz−19.2758 Hz or Ω=−16.92 Hz. The calculated whirl frequency of −16.92 Hz matches with the RPM global peak at 16.8639 Hz. Frequency components of 50 Hz and lower contribute significantly to the RPM signal. The global maximum at ~17 Hz is surrounded by several peaks of approximately half its strength corresponding to frequencies between 0 and 30 Hz. Frequency components above 100 Hz do not contribute significantly to the RPM signal.

Graph 430 depicts whirl frequency in Hz as a function of time. Whirl frequency is calculated based on the data displayed in the graphs 410 and 420, for example by using Eq. 18. The graph 430 corresponds to an average whirl frequency of −15.8485 Hz, which is slightly smaller in magnitude (i.e., more positive) than the whirl frequency calculated based on the graphs 412 and 420. The discrepancy in the average whirl frequency of the graph 430, which is the average of the instantaneously calculated whirl frequencies plotted from time t=0 to time t=250, and the whirl frequency as shown in the graph 422 is due to instantaneous variations and oscillations in RPM, including instances of forward whirl. The graph 430 displays both forward whirl, for which the whirl frequency is greater than zero, and backward whirl, with instances of backward whirl predominating. Forward whirl appears as peaks above the horizontal minor axis corresponding to a whirl frequency of zero (i.e., Ω=0 Hz). Backward whirl appears as negative whirl frequencies, i.e., where Ω<0 Hz. The majority of the calculated whirl frequencies occur in the range between approximately −18 Hz and 0 Hz, which is shown by a rectangle 432. Whirl frequencies within the rectangle 432 correspond to whirl frequencies with values of $\Omega=-\omega(N_b+1)$, i.e., the relationship given by Eq. 8. For the six-bladed bit of FIG. 4, with values of $N_b=6$, ω≈2.36 Hz and j≈1, cutting-induced backward whirl corresponds to whirl frequencies of up to approximately 17 Hz. Cutting-induced backward whirl is identified as backward whirl which follows the relationship given by Eq. 8, and is that whirl which falls into the rectangle 432. The backward whirl depicted in FIG. 4 can therefore be identified as cutting-induced backward whirl, where the majority of whirl frequencies satisfy Eq. 8.

Graph 440 depicts whirl radius in inches (in.), where the whirl radius is calculated using Eq. 19 or another appropriate calculation. The average whirl radius is 0.092663 in. Whirl radius ranges from 0 in. to approximately 0.5 in. The graph 440 shows two sets of most common instantaneous whirl radius values—at 0 in. and at approximately 0.9-1.0 in. The graph 400 also displays multiple local maxima of whirl radius of around 0.5 in.

Figure 5:
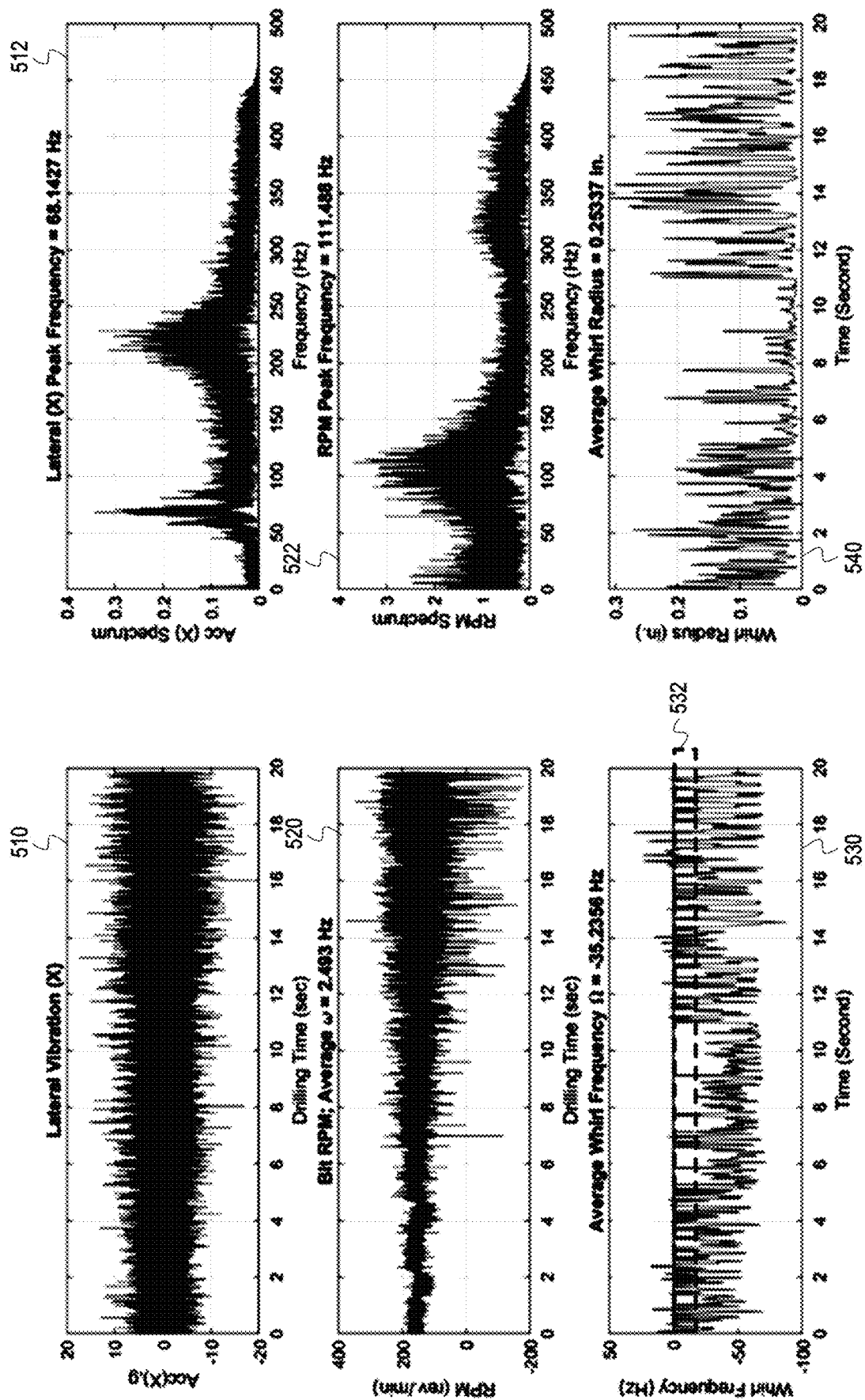
FIG. 5 depicts graphs corresponding to an example of friction-induced backward whirl measured during drilling.

FIG. 5 depicts graphs corresponding to an example of friction-induced backward whirl measured during drilling. FIG. 5 displays measurements corresponding to backward whirl for an 8¾"V PDC bit with five blades. Graph 510 depicts lateral acceleration in units of g as a function of time. The graph 510 displays lateral acceleration with a mean slightly above zero (i.e., 0 g) and with approximately equal positive and negative dispersion from the mean. The graph displays more variation as time progresses, with maximum dispersion from t=14 sec onwards. The variation in lateral acceleration appears between −10 g and 10 g for time t=0 sec to time t=6 sec, and between −20 g and 20 g for time t=12 sec and onward.

Graph 512 corresponds to an FFT frequency spectrum of the lateral acceleration data displayed in the graph 510. The frequency components of the lateral acceleration correspond to $(\omega-\Omega)$. The graph 512 displays multiple strong frequency components between 45 and 86 Hz, with a global maximum at a frequency of 68.1427 Hz. The graph 512 further displays multiple strong frequency components between 200 and 250 Hz and moderate background contribution from frequencies between 45 and 450 Hz.

Graph 520 depicts RPM as a function of time. The data of the graph 520 corresponds to an average drill bit angular frequency of 2.493 Hz (i.e., $\omega$=2.493 Hz). The average RPM is approximately 190 rev/min and displays greater variance as a function of time. The maximum RPM is approximately 300 rev/min, while the minimum RPM is approximately −200 rev/min. Larger dispersion in the RPM data corresponds to worsening backward whirl as a function of time or to drill bit stuttering.

Graph 522 corresponds a frequency spectrum of the RPM data displayed in the graph 520. The graph 522 displays a global maximum at a frequency of 111.488 Hz, with significant contributions from frequency components of 150 Hz and lower.

Graph 530 depicts whirl frequency in Hz as a function of time. Whirl frequency is calculated based on the data displayed in the graphs 510 and 520 by using Eqs. 18. The graph 530 corresponds to an average whirl frequency of −35.2356 Hz. Whirl frequency is predominantly negative, with a maximum value of approximately 20 Hz and a minimum value of approximately −70 Hz.

Based on the average drill bit frequency of $\omega$=2.493 Hz (as shown in the graph 520) and the dominant lateral vibration peak at $(\omega-\Omega)\approx$45-86 Hz as shown in the graph 512, the whirl frequency is $\Omega$=2.493 Hz-(45-86) Hz, or $\Omega$=−42.51-83.51 Hz. This calculated whirl frequency corresponds to the whirl frequencies as shown in the graph 530, where whirl frequency is predominantly between −30 and −70 Hz indicating the backward whirl is friction-induced.

Whirl frequencies within rectangle 532 correspond to cutting-induced whirl frequencies with values of $\Omega=-\omega(N_b+1)$, i.e., the relationship given by Eq. 8. For the five-bladed bit of FIG. 5, with values of $N_b$=5, $\omega\approx$2.49 Hz and j=1 or 2, cutting-induced backward whirl corresponds to whirl frequencies of −14.94 Hz or −27.39 Hz. However, most of the backward whirl displayed in the graph 530 does not fall within the rectangle 532, and therefore do not correspond to cutting-induced backward whirl.

Graph 540 depicts whirl radius in inches (in.) calculated using Eq. 19. The average whirl radius is 0.25337 in. Whirl radius ranges from 0 in. to approximately 0.3 in, with whirl radius values between 0.12" and 0.27" predominating. The whirl radius is used to calculate the borehole diameter, as the drill bit diameter is known and the location of the sensors on the drill bit, via. Eqs. 19-22 or similar relationships. For friction-induced backward whirl, whirl frequencies follow Eq. 6 rather than Eq. 8. If it is assumed that the slip-related dimensionless constant k=1.0 and if the whirl radius is known, then the friction-induced backward whirl can be calculated. For this example, friction-induced backward whirl is expected to have frequencies between −40 Hz and −80 Hz. The agreement between measured whirl frequencies and calculated or expected values of friction-induced backward whirl indicate that the graphs of FIG. 5 correspond to instances of friction-induced backward whirl.

Figure 6:
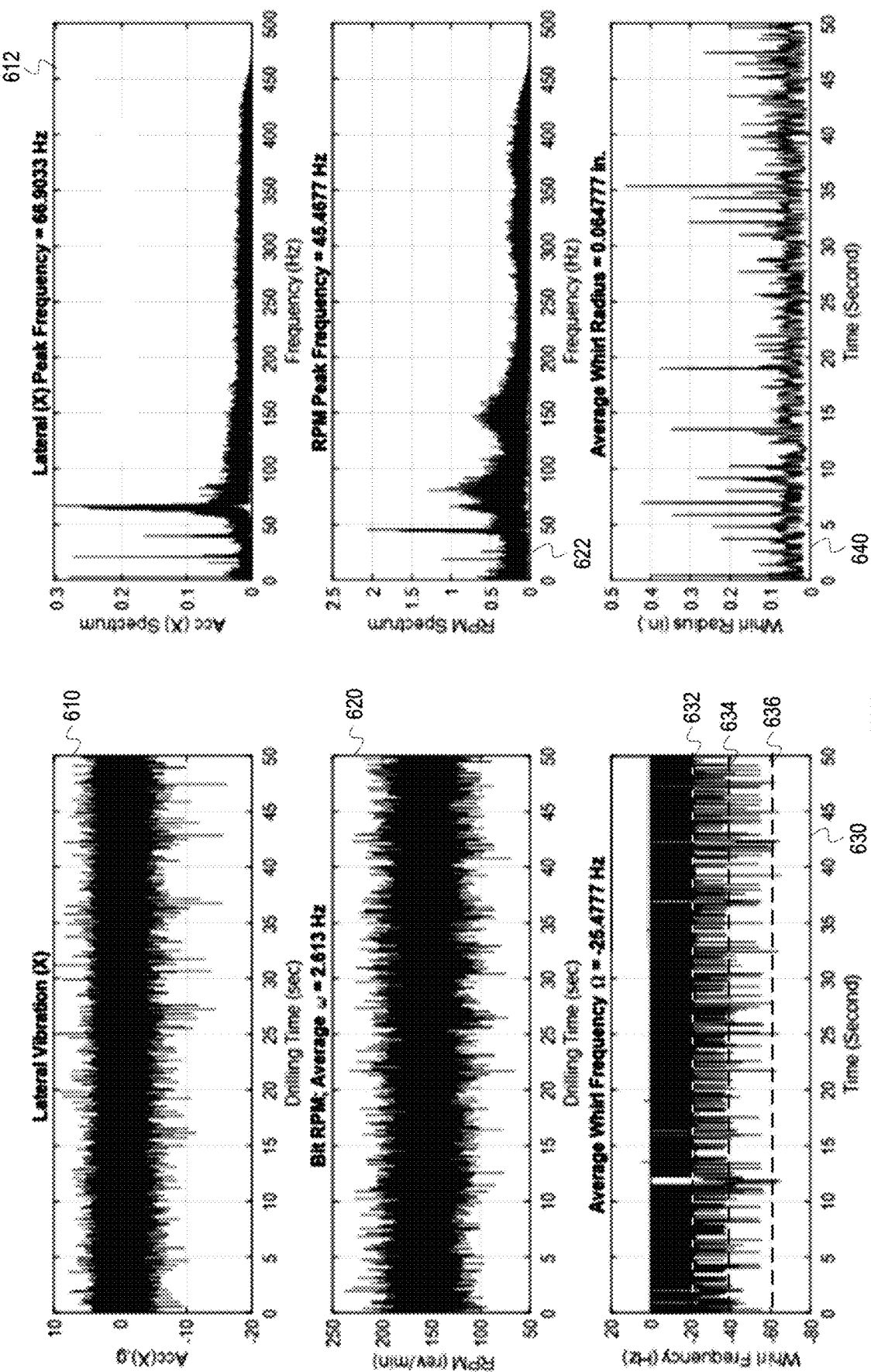
FIG. 6 depicts graphs corresponding to an example of friction-and-cutting-induced backward whirl measured during drilling.

FIG. 6 depicts graphs corresponding to an example of friction-and-cutting-induced backward whirl measured during drilling. FIG. 6 displays measurements corresponding to backward whirl for a 12¼" PDC bit with six blades using in a push-the-bit rotary steerable system (RSS). Graph 610 depicts lateral acceleration in units of g as a function of time. The graph 610 displays lateral acceleration with a mean slightly below zero (i.e., 0 g) and with approximately equal positive and negative dispersion from the mean. The maximum lateral acceleration is approximately 10 g, while the minimum lateral acceleration is approximately −15 g.

Graph 612 corresponds to an FFT frequency spectrum of the lateral acceleration data displayed in the graph 610. The frequency components of the lateral acceleration correspond to $(\omega-\Omega)$. The graph 612 displays three dominant frequencies at 21.13 Hz, at 39.87 Hz, and at 66.90 Hz. The frequency peak at 66.90 Hz represents a global maximum with significant contribution to the spectrum from surrounding or satellite peaks.

Graph 620 depicts RPM as a function of time. The data of the graph 620 corresponds to an average drill bit angular frequency of 2.613 Hz (i.e., ($\omega$=2.613 Hz). The average RPM is approximately 160 rev/min and displays equal variance in the positive and negative directions. The maximum RPM is approximately 240 rev/min, while the minimum RPM is approximately 70 rev/min. Based on the average bit rotational speed and the three peaks in the frequency domain of the lateral acceleration, three whirl frequencies are calculated. These are given by $\Omega_1$=2.61 Hz-21.13 Hz=−18.51 Hz, $\Omega_2$=2.61 Hz-39.87 Hz=−37.26 Hz, and $\Omega_3$=2.61 Hz-66.90 Hz=−64.29 Hz.

Graph 622 corresponds a frequency spectrum of the RPM data displayed in the graph 620. The graph 622 displays a global maximum at a frequency of 45.4677 Hz, with significant contributions from frequency components of 170 Hz and lower.

Graph 630 depicts whirl frequency in Hz as a function of time. Whirl frequency is calculated based on the data displayed in the graphs 600 and 620 by using Eq. 18. The graph 630 corresponds to an average whirl frequency of −25.4777 Hz. Whirl frequency is approximately entirely negative, with a minimum value of approximately −65 Hz. Dashed lines 632 corresponds to a frequency of approximately −19 Hz, dashed line 634 corresponds to a frequency of approximately −37 Hz, and dashed line 636 corresponds to a frequency of approximately −58 to −64 Hz. Each of the dashed lines 632, 635, and 636 corresponds to a set of recurring values in the whirl frequency. The dashed line 632 at −19 Hz corresponds approximately to the first calculated whirl frequency where $\Omega_1$=−18.51 Hz. The first whirl frequency also corresponds to cutting-induced frequency of the bit, where Eq. 8 is solved as $\Omega_{bit}$=−ω($N_b$+1)=−2.61 Hz(6+1)=−18.27 Hz. Therefore, the first whirl frequency corresponds to cutting-induced backward whirl.

The dashed line 634 at −37 Hz corresponds approximately to the second calculated whirl frequency where $\Omega_2$=−37.26 Hz. The second whirl frequency corresponds approximately to a cutting-induced frequency of the bit, where j=2 and Eq. 8 is solved as $\Omega_{bit}$=−ω(2$N_b$1)=−2.61 Hz(12+1)=−33.94 Hz. However, the second whirl frequency also corresponds approximately to a friction-induced frequency of the bit. Graph 640 depicts whirl radius in in. calculated using Eq. 19. The average whirl radius is 0.064777 in, Whirl radius ranges from 0 in. to approximately 0.4 in, with whirl radius values between 0.0" and 0.46" predominating. If it is assumed that the slip-related dimensionless constant k=1.0 and if the whirl radius 0.429" (where 0.429"≈$\Delta R_{max}$) of the graph 640 is used, then the friction-induced backward whirl can be calculated where $\Omega_{bha}$=−37.26 Hz. This means that the second frequency may be cutting-induced or friction-induced.

The dashed line 636 at which corresponds to frequencies between −58 and −64 Hz and roughly corresponds to the third calculated whirl frequency of $\Omega_3$=−64.29 Hz. Cutting-induced frequencies where j=3 (Ω=−49.59 Hz), j=4 (Ω=−65.25 Hz), and j=5 (QΩ=−80.91) are weaker than lower order cutting-induced backward whirl frequencies for j=1 or j=2. It is more likely that the third calculated whirl frequency instead corresponds to a friction-induced backward whirl (where whirl frequency follows Eq. 6). The third whirl frequency is too large (i.e., does not correspond to Eq. 8 for j=1 or j=2) to correspond to a cutting-induced backward whirl and therefore corresponds to friction-induced backward whirl.

In instances where both cutting-induced and friction-induced backward whirl is detected, backward whirl is hereafter classified as friction-induced. Several instances of both cutting-induced and friction-induced backward whirl were detected during drilling runs, where in these instances friction-induced backward whirl is predominant or assumed to be predominant.

In order to correlate drill bit design parameters, 146 PDC bits with different cutting structures were designed and tested during drilling. Drill bits ranging in size from 6⅛" to 17½" with between five and eight blades were studied, Most bit designs were field tested with two or more drilling runs, where the multiple drilling runs were run with different operators under different conditions. The gauge pad characteristics of the PDC drill bits are summarized in Table 1, below. For vertical drilling, some PDC bits are equipped with full gauge pads. A full gauge pad is more likely to contact a formation surface, including the borehole sidewall, than a non-full gauge pad. As is shown in Table 1, PDC bits with full gauge pads exhibit greater probability of experiencing backward whirl both friction-induced and cutting-induced. The number of full gauge bits which experienced friction-induced backward whirl (11%) is greater than the number of non-full gauge bits which experienced friction-induced backward whirl (6%). The number of full gauge bits which experienced cutting-induced backward whirl (28%) is greater than the number of non-full gauge bits which experienced cutting-induced backward whirl (18%).

TABLE 1

Statistics on backward whirl occurrences as a function of gauge pad fullness.

| Gage Features | Full Gauge | Non-Full Gauge | Total |
| --- | --- | --- | --- |
| Total Number of Runs | 78 | 210 | 288 |
| Number of Friction-Induced Backward Whirl | 9 | 13 | 21 |
| Number of Cutting-Induced Backward Whirl | 22 | 37 | 59 |
| Ratio of Backward Whirl Occurrences | 39.74% | 23.81% | 27.78% |

Figure 7:
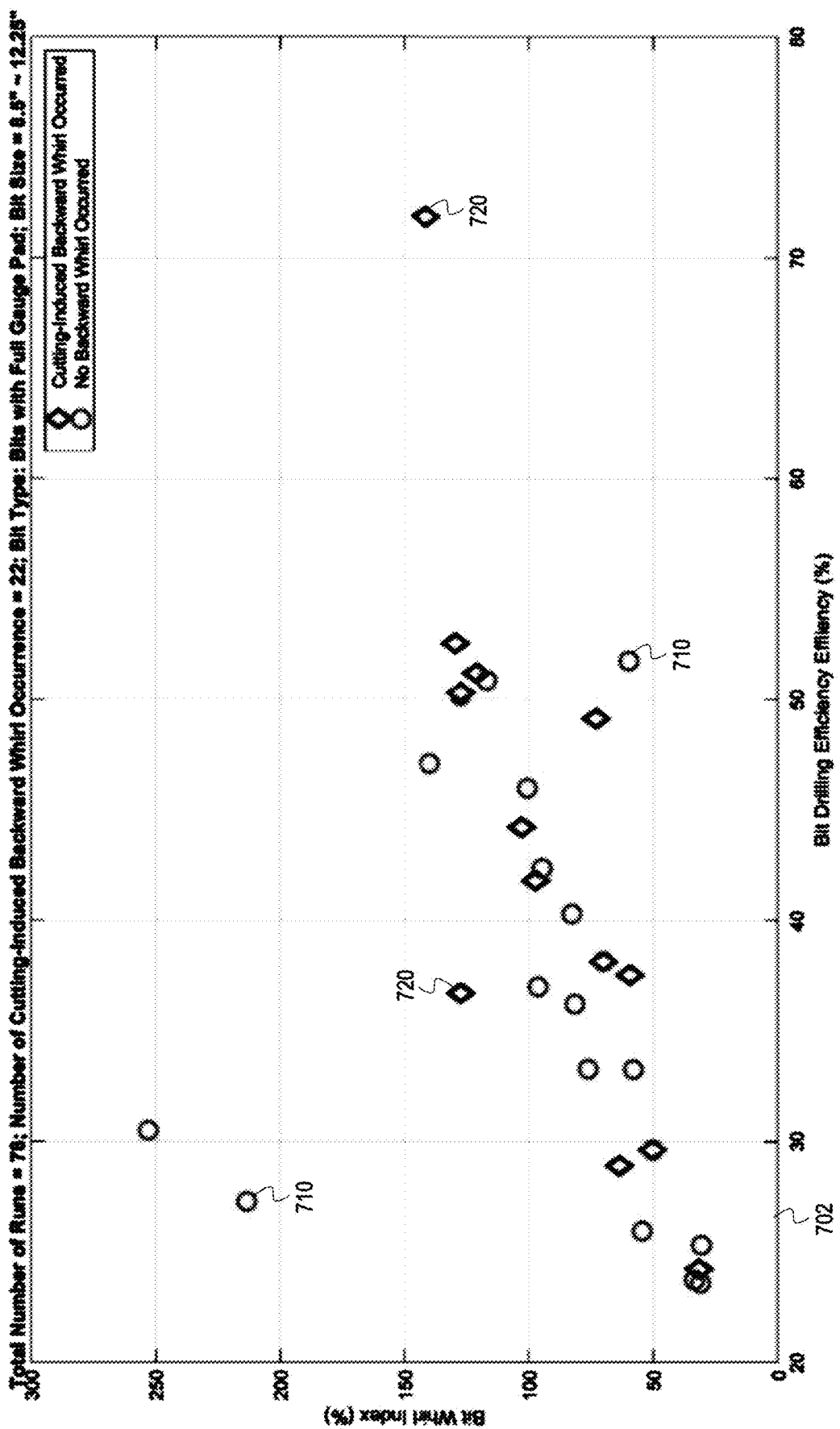
FIG. 7 illustrates an example graph of detected cutting-induced backward whirl as a function of bit drilling efficiency (DE) and bit whirl index for PDC bits with full gauge pads.

FIG. 7 illustrates an example graph of detected cutting-induced backward whirl as a function of bit drilling efficiency (DE) and bit whirl index for PDC bits with full gauge pads. Graph 702 depicts a plot of the 78 drilling runs for full gauge PDC drill bits as a function of drilling efficiency (DE) and whirl index (WI), where both DE and WI are plotted as percentages. The 78 drilling runs correspond to those identified in Table 1 with full gauge. PDC bit size ranged from 8.5" to 12.25". In 22 drilling runs, instances of cutting-induced backward whirl were detected. Drilling runs where no backward whirl was detected are represented by circles 710, while the 22 runs where cutting-induced backward whirl was detected are represented by diamonds 720.

Instances of cutting-induced backward whirl are spread across the x and y-axes, corresponding to values of DE as low as ~15% and as high as ~73% and corresponding to WI as low as ~30% and as high as ~150%. The spread of instances of cutting-induced backward whirl across the range of DE and WI means that it is difficult to mitigate cutting-induced backward whirl for a PDC drill bit with a full gauge. The distributions for instances of cutting-induced backward whirl and drilling runs without cutting-induced backward whirl overlap significantly.

Figure 8:
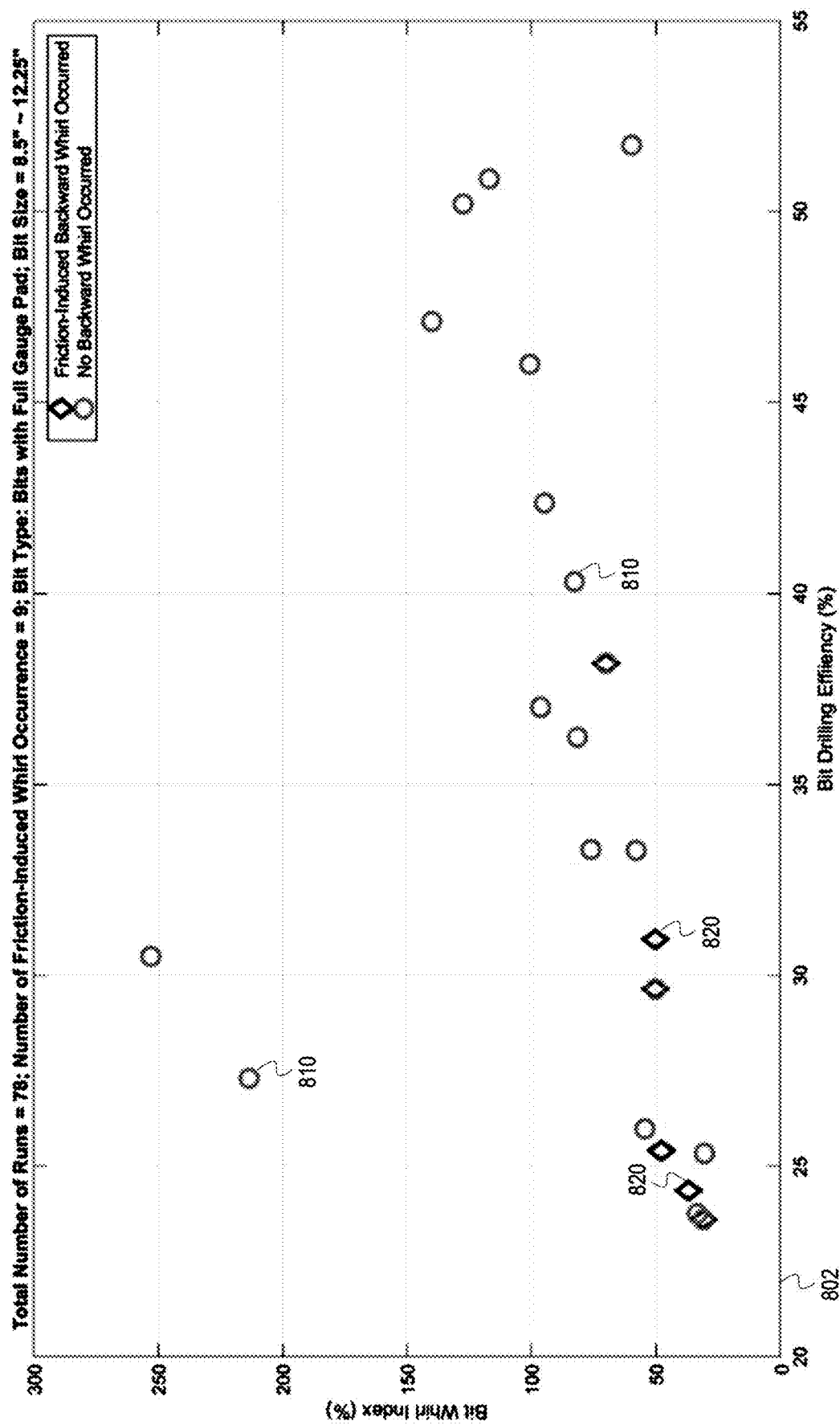
FIG. 8 illustrates an example graph of detected friction-induced backward whirl as a function of bit drilling efficiency (DE) and bit whirl index for PDC bits with full gauge pads.

FIG. 8 illustrates an example graph of detected friction-induced backward whirl as a function of bit drilling efficiency (DE) and bit whirl index for PDC bits with full gauge pads. Graph 802 depicts a plot of the 78 drilling runs for full gauge PDC drill bits as a function of drilling efficiency (DE) and whirl index (WI) as percentages. The 78 drilling runs correspond to those identified in Table 1 with full gauge. PDC bit size ranged from 8.5" to 12.25". In 9 drilling runs, instances of friction-induced backward whirl were detected. Drilling runs where no backward whirl was detected are represented by circles 810, while the nine runs where friction-induced backward whirl was detected are represented by diamonds 820. Instances of friction-induced backward whirl occur for DE less than 38.5%. Friction-induced backward whirl is therefore mitigated for DE>38.5%.

Figure 9:
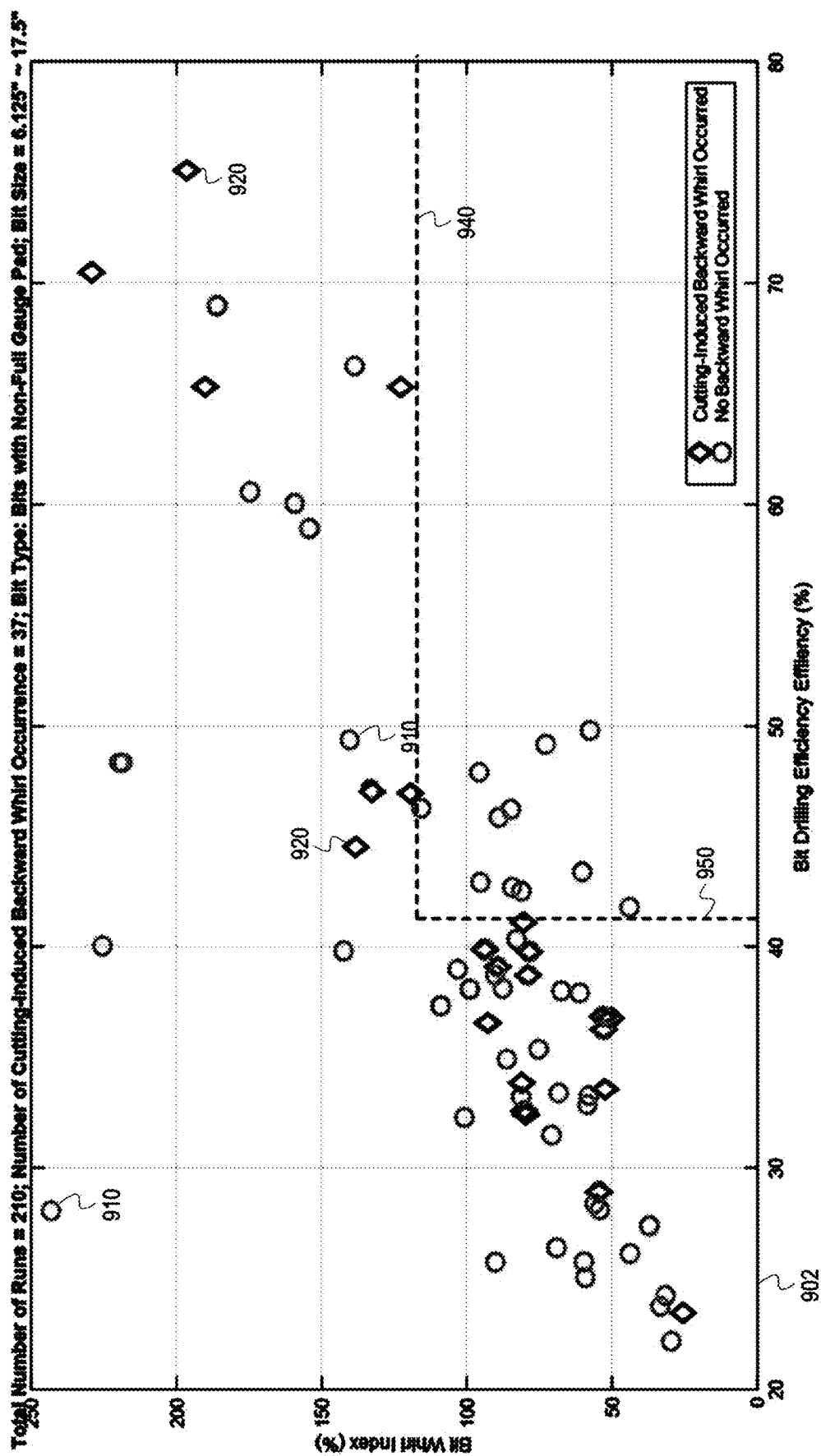
FIG. 9 illustrates an example graph of detected cutting-induced backward whirl as a function of bit drilling efficiency (DE) and bit whirl index for PDC bits with non-full gauge pads.

FIG. 9 illustrates an example graph of detected cutting-induced backward whirl as a function of bit drilling efficiency (DE) and bit whirl index for PDC bits with non-full gauge pads. Graph 902 depicts a plot of the 210 drilling runs for non-full gauge PDC drill bits as a function of drilling efficiency (DE) and whirl index (WI) as percentages. The 210 drilling runs correspond to those identified in Table 1 with non-full gauge. PDC bit size ranged from 6.125" to 17.5". In 37 drilling runs, instances of cutting-induced backward whirl were detected. Drilling runs where no backward whirl was detected are represented by circles 910, while the 37 runs where cutting-induced backward whirl was detected are represented by diamonds 920. Instances of cutting-induced backward whirl occur for either DE less than 42% or WI greater than 120%. Cutting-induced backward whirl is therefore mitigated for DE>42% and WI less than 120%. The range of mitigation is shown as dashed line 940 representing WI of 120% and dashed line 950 representing DE of 42%.

Figure 10:
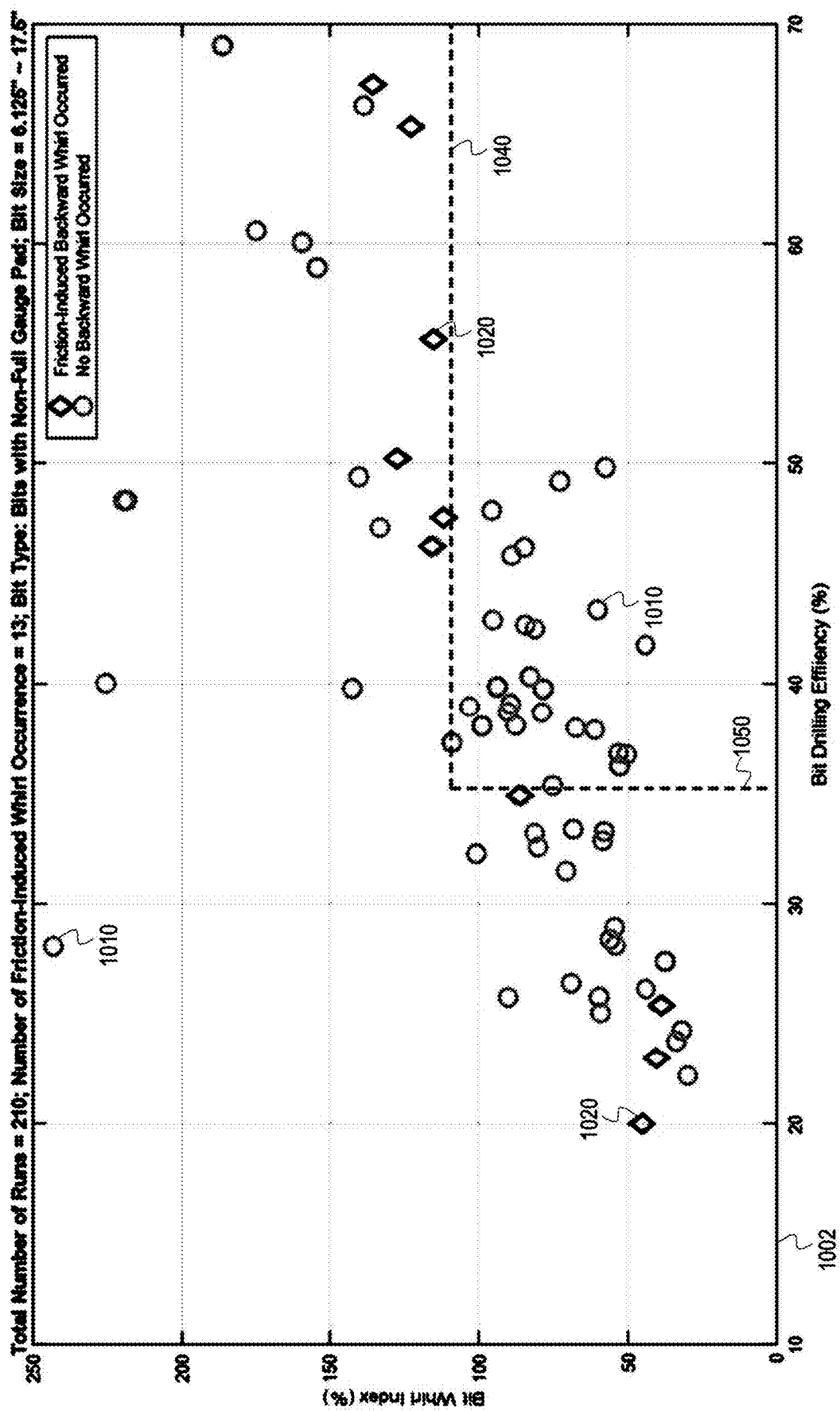
FIG. 10 illustrates an example graph of detected friction-induced backward whirl as a function of bit drilling efficiency (DE) and bit whirl index for PDC bits with non-full gauge pads.

FIG. 10 illustrates an example graph of detected friction-induced backward whirl as a function of bit drilling efficiency (DE) and bit whirl index for PDC bits with non-full gauge pads. Graph 1002 depicts a plot of the 210 drilling runs for non-full gauge PDC drill bits as a function of drilling efficiency (DE) and whirl index (WI) as percentages. The 210 drilling runs correspond to those identified in Table 1 with non-full gauge. PDC bit size ranged from 6.125" to 17.5". In thirteen drilling runs, instances of friction-induced backward whirl were detected. Drilling runs where no backward whirl was detected are represented by circles 1010, while the thirteen runs where friction-induced backward whirl was detected are represented by diamonds 1020. Instances of friction-induced backward whirl occur for either DE less than 35% or WI greater than 110%. Friction-induced backward whirl is therefore mitigated for DE>35% and WI less than 110%. The range of mitigation is shown as dashed line 1040 representing WI of 110% and dashed line 1050 representing DE of 35%.

Characteristics of PDC drill bits for mitigating or avoiding backward whirl, both friction-induced and cutting-induced, can be calculated from the set of drilling data including vibrational measurements. As an example, data from the set of drilling runs discussed in reference to Table 1 is included in FIGS. 7, 8, 9, and 10. Based on this data set, drill bit characteristics for backward whirl mitigation are calculated. To mitigate both cutting-induced and friction-induced backward whirl, a PDC bit design should follow three design limitations: (1) non-full gauge pad, (2) DE (of both cutters and DOCCs (if any)) should be greater than 42%, and (3) WI (of both cutters and any DOCCs) should be less than 11.0%. These limitations can be used as design rules directly, or can be used to generate design rules for other drill bit design parameters upon which they are calculated. For instance, limitation (1) can be translated directly to a design rule (1) where gauge pads should be non-full. Limitations (2) and (3) can be used to generate design rules for interrelated drill bit design parameters, such as depth of cut, number of cutters and bit radius, etc. These limitations, rules, and guidelines are based on the data included here, and could vary based on other drill bit or drilling characteristics, such as formation type, rock type, vertical versus horizontal drilling, number of blades, etc.

PDC bit backward whirl can be initiated by interactions between the drill bit and one or more formation face. PDC bit backward whirl can also be initiated by undesirable or uneven BHA motion. In order to determine that backward whirl was characteristic of a PDC drill bit design, multiple drill bits were operated by different drilling operators under different drilling conditions. Drill bits for which multiple runs were measured are summarized in Table 2, below. Within the drilling data was included data on drilling runs corresponding to 31 different PDC bit designs, each of which was subjected to at least three drilling runs. For fourteen of the drill bit designs, none of the three of more drilling runs displayed any evidence of backward whirl. These drill bit designs were free from backward whirl in multiple, repeatable drilling runs so backward whirl can be assumed to be mitigated for these designs. For ten of the 31 multiple drilling run PDC bit designs, backward whirl occurred in at least two of the drilling runs measured. That is, backward whirl repeatably recurred for these ten PDC bit designs. For four of these multiple drilling run PDC bit designs, backward whirl occurred in at least three of the drilling runs measured,

TABLE 2

Reproducibility statistics for backward whirl of a PDC bit over multiple drilling runs.

| | |
|---|---|
| Number of Bit Designs with 3 or More Runs | 31 |
| Number of Bit Designs with No Backward Whirl in the 3 or More Runs | 14 |
| Number of Bit Designs with Backward Whirl in at least 2 Runs | 10 |
| Number of Bit Designs with Backward Whirl in at least 3 Runs | 4 |

The repeatability and reproducibility of backward whirl for the same drill bit design over drilling runs with different operators and different conditions indicates that backward whirl is a function of drill bit design, at least to an extent. The repeatability and reducibility of drilling runs without backward whirl for the same drill bit design indicates that the mitigation of backward whirl through drill bit design is possible, and therefore desirable.

For a 12¼" PDC drill bit with seven blades, a summary of drilling runs together with occurrences of detected whirl is provided in Table 3, below. The drilling efficiency (DE) of this drill bit was calculated as 23.6%. Because of its low DE, backward whirl is likely where backward whirl is mitigated for DE>42% as previously calculated. Nine drilling runs where measured for this drill bit, with their backward whirl characteristics summarized in Table 3. The drilling run identifiers are arbitrary, and identify the drilling runs corresponding to the selected bit out of the totality of drilling runs previously discussed. In six of the nine runs, backward whirl was detected. In two runs, both cutting-induced and friction-induced backward whirl occurred, at different whirl frequencies. For four drilling runs, cutting-induced backward whirl alone was detected. The whirl frequencies of the detected cutting-induced whirl are similar, as is expected for backward whirl frequencies obeying Eq. 8. The whirl frequencies of the detected friction-induced backward whirl display greater variation, which can be caused by variability of the slip related dimensionless constant k and by variations in borehole diameter, as accounted for in Eq. 6.

TABLE 3

Occurrences of backward whirl for nine drilling runs of a 12¼" bit with seven blades.

| Run # | 37 | 60 | 79 | 94 | 230 | 231 | 232 | 233 | 234 |
|---|---|---|---|---|---|---|---|---|---|
| Whirl Freq (Hz) | 10 | 18 38 | 20 63 | 16 | 17 | 0 | 17 | 0 | 0 |

TABLE 3-continued

Occurrences of backward whirl for nine drilling runs of a 12¼" bit with seven blades.

| Run # | 37 | 60 | 79 | 94 | 230 | 231 | 232 | 233 | 234 |
|---|---|---|---|---|---|---|---|---|---|
| Whirl Type | Cutting | Cutting Friction | Cutting Friction | Cutting | Cutting | NA | Cutting | NA | NA |

The repeatability of backward whirl, as shown in Table 3, indicates that drill bit characteristics are more important for determining the likelihood of backward whirl than drilling conditions. For some drill bits designs, backward whirl is reproducible while for other drill bit designs backward whirl is unlikely. In this manner, and based on the previously calculated guidelines or similar, PDC drill bit design can mitigate occurrence of backward whirl.

Figure 11:
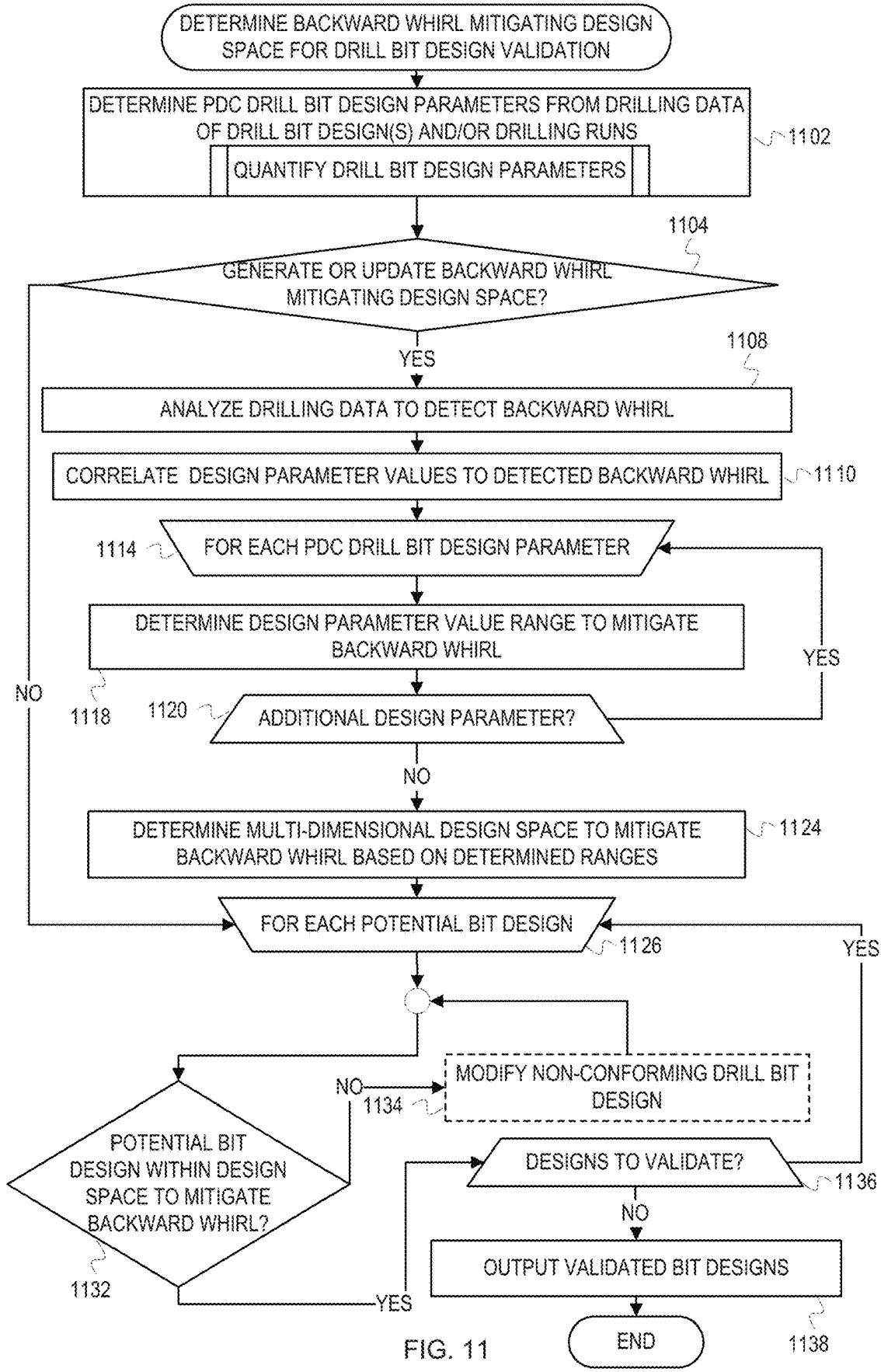
FIG. 11 is a flowchart of example operations for determining a multi-dimensional backward whirl mitigating design space for drill bit design validation.

FIG. 11 is a flowchart of example operations for determining a multi-dimensional backward whirl mitigating design space for drill bit design validation. A drill bit design validator can contain or be in communication with a drill bit design quantifier, which will be described in reference to FIG. 12. Optionally, the drill bit design validator can update previously generated drill bit design guidelines based on new drilling data.

At block 1102, the drill bit design validator determines PDC drill bit design parameters. Determination of PDC drill bit design parameters includes quantifying the drill bit parameters. Quantifying these parameters at least yields values for DE and WI corresponding to the drill bit design (s). Example operations for quantifying the drill bit design parameters are provided in FIG. 12. The drill bit design validator can receive the PDC drill bit design parameters from the drill bit design quantifier, can send detected drill bit designs to the drill bit design quantifier for quantification, or can include the drill bit design quantifier as part of the drill bit design validator. The drill bit design validator can select each drill bit design included in a set of drill bit designs for validation or for which drilling data is included and quantify drill bit design parameters via the drill bit design quantifier. Quantify, quantifier, quantification and any grammatical form thereof hereafter mean to make explicit a numerical value or other variable value for a design parameter or bit characteristic that may or may not correlate directly or naturally to a single numerical value (for example, DE can be a function of changing drilling parameters and of many variables involved in drill bit design, but can be represented as an average DE, theoretical DE, ideal DE, etc.). PDC drill bit design parameters previously discussed include gauge fullness, DE, and WI, but additional or other design parameters can be calculated and analyzed to generate design parameter guidelines.

PDC drill bit designs correspond to a plethora of quantifiable and adjustable measurements, dimensions, and angles: drill bit radius, cutter dimensions, number of cutters, rake angles, DOCC radial locations, etc. For simplicity, drill bit design characteristics will be used hereinafter to refer to the totality of measurable or adjustable dimensions, quantities, angles, types of components, etc. It can be difficult to correlate such a plurality of possible design characteristics to detected or observed drilling behavior. In order to correlate PDC drill bit designs to instances of backward whirl, a PDC drill bit design is correlated to one or more design parameters that quantify sets or subsets of one or more drill bit design characteristics. Design parameters allow PDC drill bit designs to be grouped into families (such as by gauge characteristics) and allows overall effects of the individual PDC drill bit design characteristics to be correlated to drilling events.

At block 1104, the drill bit design validator determines whether to generate or update a multi-dimensional design space to mitigate backward whirl. For instance, the drill bit design validator determines if there is any new vibrational or drilling data, with which to generate backward whirl mitigation drill bit design guidelines. If there is no new data, flow continues to block 1126 and drill bit designs are validated based on previous or stored guidelines. If there is new data or no previously established design guidelines, for example when drill bit design guidelines are initially generated based on a set of drilling data, flow continues to block 1108.

At block 1108, the drill bit design validator analyzes drilling data from either real-world drilling data (e.g., measurements) or from simulated drilling data, to detect instances of backward whirl. Instances of backward whirl are detected from measurements of axial, lateral, and torsional oscillation of the drill bit or BHA, as discussed in reference to FIGS. 4, 5, and 6. Individual drilling runs can correspond to both the detection and the absence of backward whirl, or drilling runs can correlate to backward whirl if any instance of backward whirl is detected. Optionally, different regimes/types of backward whirl can be identified separately and used to generate separate guidelines. For instance, cutting-induced backward whirl and friction-induced backward whirl instances can be separately analyzed to produce separate guidelines or guidelines which are later combined.

At block 1110, the drill bit design validator correlates PDC drill bit design parameter values of the drilled or simulated drill bits to instances of backward whirl and drilling runs without backward whirl. PDC drill bit design parameter values can be binary, i.e., a feature is present or not, in the case of a drill bit characteristic such as gauge fullness. In that case, the PDC drill bit design parameter values can be 0 or 1, or yes versus no, or another binary or similar value. For other PDC drill bit design parameters, values can be in percentages, inches, dimensionless numbers, etc. The drill bit design validator tags or selects the drill bit design parameters that correspond to drilling runs with detected backward whirl. Alternatively, the drill bit validator can bin, batch, or group drilling run data into a set of drilling runs with detected backward whirl and a set of drilling data without detected backward whirl. The relationship can be a one-to-one determination of detected backward whirl for a set of design parameters, or it can be a probability or likelihood of backward whirl based on detected backward whirl for similar design parameter values. For each drill bit design parameter of each drill bit and drilling run, calculated values are identified as corresponding to an instance of backward whirl or as corresponding to no detected backward whirl. Drill bit design parameters may have the same or different values for different drilling runs of the same bit.

At block 1114, the drill bit design parameter validator selects one drill bit design parameter for determination. The drill bit design parameters can be interrelated and comprise one or more of: DE, WI, gauge fullness, etc. While design parameters may be interrelated (for example DE can be calculated with or without contributions from gauge pads), ranges of parameters which correlate to mitigated backward whirl may be related in unexpected ways. The drill bit validator analyzes a parameter separately to determine the range of values which correspond to mitigated backward whirl. Optionally, at least one design parameter (such as DE) is analyzed in correlation with each other design parameter such that relationships between mitigation ranges for one or more parameters are calculated.

At block 1118, the drill bit design parameter validator determines a range of the selected design parameter values that corresponds to mitigated backward whirl. The value range can be a set of values, a single value, or (such as in the case of a binary PDC drill bit design parameter) the presence or absence of a drill bit characteristic. The drill bit design validator determines a range of values for backward whirl mitigation based on the values of the PDC drill bit design parameters for which backward whirl is not detected, as compared to the values of the design parameter for which backward whirl is detected. The determined range can be open ended (i.e., all values above a threshold are allowable), can be closed (i.e., only values above a lower threshold and below an upper threshold are allowable), or can correspond to an ideal value and values near such a mean or median for suppression of backward whirl. The determined range can be based on absence of backward whirl, infrequency of backward whirl, or determination of the presence of a smaller magnitude or frequency of backward whirl. The drill bit design validator determines, based on PDC drill bit design parameters identified as corresponding to detected backward whirl, a set of values including each bit design and performance parameter that are related to backward whirl. Design guidelines can be exclusionary, such that any design parameter value for which backward whirl are detected is removed from the multi-dimensional design parameter space (optionally including a range of values surrounding the value for which backward whirl is detected). Design rules or guidelines can be generated based on one or more design parameters. Design guidelines can also comprise both minimal requirements and preferred ranges for one or more PDC bit design parameters. Average, median, or mean PDC bit design parameters from drilling runs without detected backward whirl or midpoint or other point within a range can be selected as preferred values for PDC bit design parameters. In order to mitigate backward whirl, instances of detected backward whirl are controlling on design parameters values i.e., the presence of any detected backward whirl for a drill bit design parameter predisposes that value for exclusion unless enough data at or near that value shows that detected backward whirl is unlikely, such as many other drilling runs for which that value corresponds to instances where no backward whirl is detected.

At block 1120, the drill bit design parameter validator determines if any further drill bit design parameters remain to be analyzed. One or more design parameters have not been analyzed, flow continues to the design parameter range determination loop at block 1114. If all design parameters have been analyzed, flow continues to block 1124.

At block 1124, the drill bit design parameter validator determines a multi-dimensional design space for backward whirl mitigation based on determined ranges for the one or more design parameters. Determination comprises generation of the multi-dimensional design space from a set of measurements corresponding to multiple drilling runs and further comprises updating one or more parameter of an existing multi-dimensional design space based on new, additional, or higher quality measurements corresponding to one or more drilling run. The drill bit design validator can identify one or more range or limit in one or more drill bit design parameters for which there are no (or statistically few) detected instances of backward whirl. The multi-dimensional design space is identified by comparing the determined values for all drill bit design parameters. The multi-dimensional space is the set of values or range of values across all compared drill bit design parameters, where a drill bit with design parameters falling within that space, is expected to be free from backward whirl or where previous designs within that space experienced no detected backward whirl. The multi-dimensional design space comprises values of multiple parameters, or multi-parameter values (i.e., values of multiple parameters together) for which backward whirl is mitigated. In some cases, mitigation ranges in one design parameter can correspond to instances of high backward whirl likelihood in another parameter since design parameters can be interrelated. In such cases, the multi-dimensional design space for backward whirl mitigation omits any regions where one or more variables lies outside a range of mitigated backward whirl. The multi-dimensional space where backward whirl is mitigated is output or stored as a set of design rules or guidelines which outline values of design parameters for which backward whirl is absent, not detected, or reduced. Optionally, flow continues from block 1124 to block 1126 and potential or new PDC drill bit designs are validated against the guidelines for mitigated backward whirl.

At block 1126, the drill bit design validator selects a new or potential drill bit design for validation. The potential drill bit design can be a drill bit design included in the drilling data used to generate the multi-dimensional design space for backward whirl mitigation in block 1124. In this case, a previously used drill bit design can be checked against the design guidelines and a likelihood of backward whirl in a subsequent run can be determined or estimated. The potential drill bit design can alternatively be a drill bit design not included in the drilling data analyzed at block 1108, such as a new drill bit design not previously drilled. The drill bit design parameters, determined in block 1102, are compared against the drill bit design rules or guidelines that identify the multi-dimensional design space for which backward whirl is mitigated. Each new or potential design bit is compared, as a function of its identified drill bit design parameters, to the multi-dimensional design space.

At block 1132, the drill bit design validator decides, for each PDC drill bit design, if the drill bit design parameters conform to the design guidelines for mitigated backward whirl. The drill bit design validator compares PDC drill bit design parameters of the selected potential drill bit design to the multi-dimensional generated at block 1124. The drill bit design validator can compare the drill bit design parameters to one or more thresholds in the PDC drill bit parameters. Optionally, the drill bit design validator can compare the drill bit design parameters to one or more preferred ranges in the PDC drill bit design parameters. The drill bit design validator can identify drill bit designs that do not correspond to one or more minimum thresholds for backward whirl mitigation, drill bit designs that correspond to all minimum thresholds for backward whirl mitigation, and drill bit designs that correspond to one or more preferred ranges for backward whirl mitigation. The drill bit design validator can validate design for minimum thresholds for backward whirl mitigation, or for preferred thresholds for backward whirl mitigation. The drill bit design validator can optionally identify both minimum and preferred designs. For the drill bit designs which do not conform to the rules or guidelines outlining the multi-dimensional space for backward whirl mitigation can be discarded or (optionally where flow continues to block 1134) be adjusted to produce validated designs. For the drill bit designs conform to the guidelines, flow continues to block 1136 where validated designs are grouped or stored as a set of validated drill bit designs.

At block 1134, the drill bit design validator optionally adjusts or causes to be adjusted one or more design parameter for a potential PDC drill bit design that does not conform to the multi-dimensional design space for backward whirl mitigation. Such adjustment can comprise adjusting a PDC drill bit design parameter that directly corresponds to one or more physical dimensions of the drill bit (i.e., gauge fullness) or can comprise adjusting a design parameter (such as DE or WI) where such as adjustment comprises calculating or adjusting one or more physical dimensions (i.e., back rake angle) of the drill bit and recalculating the design parameter for the new or adjusted drill bit design. The modification can include a calculation or re-calculation of the PDC bit design parameters, such as the calculation that occurs at block 1102, for the new or adjusted bit design. From block 1134, flow continues to block 1130, where the drill bit validator compares the modified or adjusted drill bit design to the generated guidelines. The drill bit design validator can adjust a non-conforming drill bit in one or more iteration, until such time as a maximum iteration count is reached or the drill bit design is validated at block 1132.

At block 1136, the drill bit design validator determines if every new or potential bit design has been validated. If more new or potential drill bit designs remain to be validated, flow continues to block 1126 where a new drill bit design is selected for validation. When all new or potential drill bit designs have been validated or discarded, flow continues to block 1138.

At block 1138, the drill bit design validator outputs or stores validated PDC drill bit designs for mitigated backward whirl. The drill bit design validator can also output those of the drill bit designs which are not validated as a separate data set or file. Optionally, drill bit design parameters such as WOB, RPM, ROP, ROL, etc. can be modified during drilling based on real time measurement or calculation of drill bit or BHA vibration or whirl. Average drill bit parameters are relatively independent of drilling conditions. However, adjustments to drilling parameters such as RPM, ROB, WOB, TOB, etc. can shift WI in practice. The drill bit design validator can optionally include a module for drilling parameter control, where the drill bit design validator controls or recommends drilling adjustment such that a specific drill bit is operated within the multi-dimensional space for backward whirl mitigation. The drill bit design validator can optionally include a module for backward whirl identification, where the drill bit design validator indicated the presence of backward whirl and communicates such to an operator or drilling parameter controller. The module for backward whirl identification can optionally include an identification of the regime of backward whirl, such as cutting-induced or friction-induced.

Figure 12:
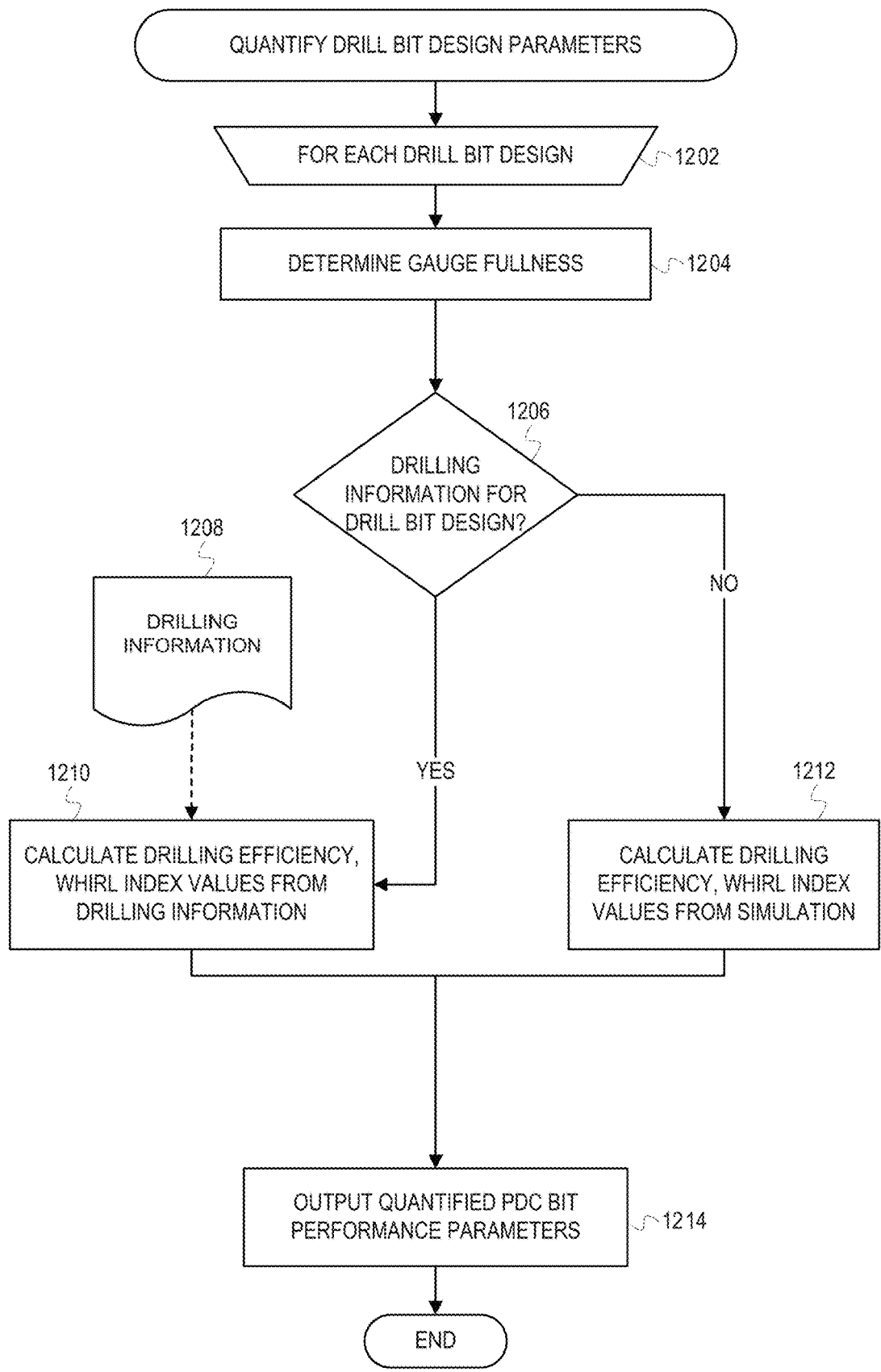
FIG. 12 is a flowchart of example operations quantifying PDC drill bit design parameters, including whirl index, for a drill bit design.

FIG. 12 is a flowchart of example operations is a flowchart of example operations quantifying PDC drill bit design parameters, including whirl index, for a drill bit design. The drill bit design quantifier calculates design parameters, such as gauge fullness, DE, WI, etc. for individual drill bit designs or groups of design in order to correlate drill bit design parameter to instances of backward whirl and to instances where no backward whirl is detected.

At block 1202, the drill bit design quantifier selects a drill bit design for quantification. If more than one drill bit design is input to the quantifier, the drill bit design quantifier operates on each drill bit design separately.

At block 1204, the drill bit design quantifier determines a gauge fullness for a selected drill bit design. Gauge fullness can be a binary measure i.e., either the gauge is full or the gauge is non-full. Gauge fullness can alternatively be calculated as a value of gauge radius or a difference between a bit radius and a gauge radius (i.e., a measure of gauge undercut). Optionally, more information about the gauge (e.g., gauge pad aggressiveness, gauge radius, gauge width, gauge length, gauge relief, etc.) can be measured, calculated, estimated, or determined.

At block 1206, the drill bit design quantifier determines if drilling information is present or accessible for the drill bit design of the current iteration. If drilling data is available, flow continues to block 1210 where drilling efficiency (DE) and whirl index (WI) are calculated from drilling information. If drilling data is not available or not selected, flow continues to block 1212 where DE and WI are calculated from simulation or estimation.

At block 1210, the drill bit design quantifier calculates drilling efficiency (DE) and a whirl index (WI) values for the drill bit from drilling information. Values of DE and WI can be calculated as percentages, probabilities, averages, maximums, minimums, etc. DE and WI can be calculated in different forms, i.e., where DE is an average and WI is a percentage. DE and WI can be calculated from drilling data, such as drilling data contained within a drilling information data set 1208, or from similar drill bits or drilling runs of previous similar drill bits. Optionally, DE and WI can be interpolated from DE and WI calculated for similar bits, where the DE and WI of the similar bits is calculated from drilling information.

At block 1212, the drill bit design quantifier calculates drilling efficiency (DE) and a whirl index (WI) values from simulation. Values can be calculated as any appropriate quantity, as discussed in reference to block 1210. DE and WI can be calculated from simulated drilling runs, from simulations of drill bit behavior, or from simulations based on measured drilling runs of similar bits. Optionally, DE and WI can be calculated based on a mixture of information from drilling runs and simulations or calculated via both methods and compared. Further drill bit design parameters can also be calculated or measured, such as depth of cut (DOC), average DOCC contact area, etc.

At block 1214, the drill bit design quantifier stores or outputs PDC bit design parameters associated with the drill bit design. The PDC bit design parameters can be output to the drill bit design validator, as discussed in reference to FIG. 11, or can be tagged or otherwise linked or identified as corresponding to each of the drill bit designs. A drill bit design, simulation of a drill bit design performance, or drilled drill bit together with its drilling data can be tagged or otherwise correlated with PDC bit design parameters for later use or validation. The design parameters shown here can be calculated in any order and may comprise more parameters or a subset of the parameters identified here.

The example operations are described with reference to drill bit design quantifier and drill bit design validator for consistency with the earlier figure(s). The name chosen for the program code is not to be limiting on the claims. Structure and organization of a program can vary due to platform, programmer/architect preferences, programming language, etc. In addition, names of code units (programs, modules, methods, functions, etc.) can vary for the same reasons and can be arbitrary.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 1210 and 1212 can be performed in parallel or concurrently. With respect to FIG. 11, modification of non-conforming drill bit designs is not necessary. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine-readable medium that can direct a machine to function in a particular manner, such that the instructions stored in the machine-readable medium produce an article of manufacture including instructions which implement the function act specified in the flowchart and/or block diagram block or blocks.

Figure 13:
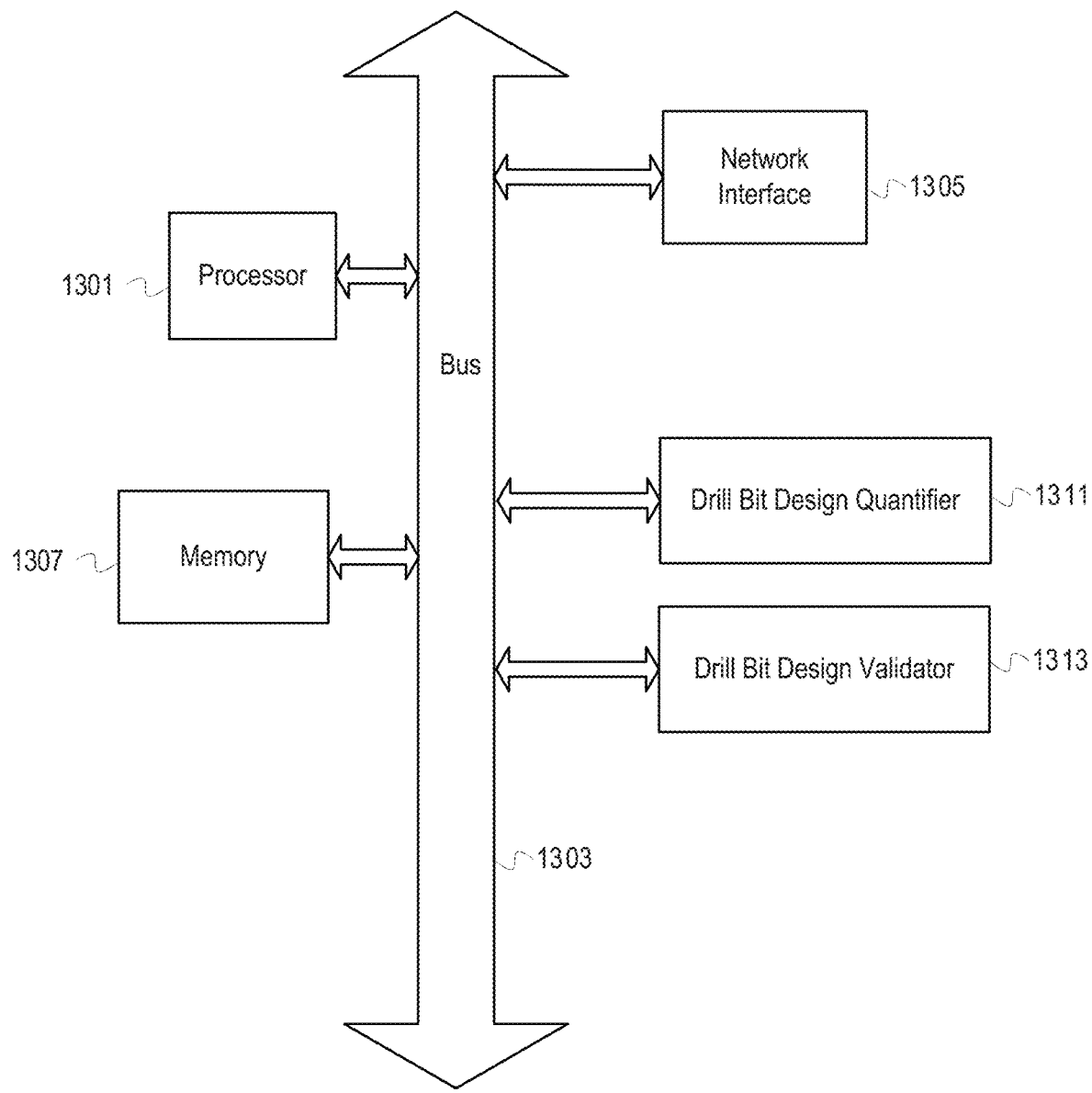
FIG. 13 depicts an example computer system with a drill bit design quantifier and a drill bit design validator.

FIG. 13 depicts an example computer system with a drill bit design quantifier and a drill bit design validator. The computer system includes a processor 1301 (possibly including multiple processors, multiple cores, multiple nodes, and/or implementing multi-threading, etc.). The computer system includes memory 1307. The memory 1307 may be system memory or any one or more of the above already described possible realizations of machine-readable media. The computer system also includes a bus 1303 and a network interface 1305. The system also includes drill bit design quantifier 1311 and drill bit design validator 1313. The drill bit design quantifier 1311 quantifies drill bit designs by generating values of drill bit design parameters. The drill bit design validator 1313 generated guidelines for drill bit design parameters where coupled vibrations are mitigated and test or validates drill bit designs against such guidelines. The drill bit design quantifier 1311 can be a part of the drill bit design validator 1313. Any one of the previously described functionalities may be partially (or entirely) implemented in hardware and/or on the processor 1301. For example, the functionality may be implemented with an application specific integrated circuit, in logic implemented in the processor 1301, in a co-processor on a peripheral device or card, etc. Further, realizations may include fewer or additional components not illustrated in FIG. 13 (e.g., video cards, audio cards, additional network interfaces, peripheral devices, etc.). The processor unit 1301 and the network interface 1305 are coupled to the bus 1303. Although illustrated as being coupled to the bus 1303, the memory 1307 may be coupled to the processor 1301.

While the aspects of the disclosure are described with reference to various implementations and exploitations, it will be understood that these aspects are illustrative and that the scope of the claims is not limited to them. In general, techniques for drill bit design quantification and drill bit design validation as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Terminology

As used herein, the term "or" is inclusive unless otherwise explicitly noted. Thus, the phrase "at least one of A, B, or C"

is satisfied by any element from the set {A, B, C} or any combination thereof, including multiples of any element.

The invention claimed is:

1. A method comprising:
   determining values for a first drill bit design parameter for a plurality of drill bit designs;
   detecting instances of backward whirl based on vibrational data;
   determining a correlation between the instances of backward whirl and the values of the first drill bit design parameter, wherein determining the correlation includes determining a set of values for the first drill bit design parameter based on an aggregate of the values for the first drill bit design parameter identified for the instances of backward whirl;
   based on the correlation, determining a set of one or more limits for the first drill bit design parameter that mitigates backward whirl; and
   generating drill bit design rules based on the determined set of one or more limits for the first drill bit design parameter.

2. The method of claim 1 further comprising:
   validating a first drill bit design based on the generated drill bit design rules, wherein validating comprises determining that a value for the first drill bit design parameter for the first drill bit design lies within the set of one or more limits for values of the first drill bit design parameter that mitigates backward whirl.

3. The method of claim 2 further comprising:
   based on a determination that the first drill bit design is not valid, adjusting the first drill bit design based on a difference between the value of the first drill bit design parameter of the first drill bit design and the set of one or more limits for values of the first drill bit design parameters that mitigates backward whirl.

4. The method of claim 1, wherein detecting the instances of backward whirl comprises:
   detecting lateral vibrations at a frequency equal to a difference between the bit rotational angular frequency ($\omega$) and the whirl frequency ($\Omega$).

5. The method of claim 4, wherein detecting instances of backward whirl further comprises at least one of detecting instances of cutting-induced backward whirl and detecting instances of friction-induced backward whirl.

6. The method of claim 1, wherein the determining the correlation further comprises:
   for each instance of backward whirl, identifying a value for the first drill bit design parameter for one of the plurality of drill bit designs, wherein the instance of backward whirl is detected in the vibrational data corresponding to the one of the plurality of the drill bit designs.

7. The method of claim 1 wherein determining the set of one or more limits for the first drill bit design parameter comprises determining at least one of a limit that drilling efficiency should be more than 42%, a limit that whirl index should be less than 110%, and a limit that gauge fullness should be non-full.

8. The method of claim 1, further comprising:
   determining values for a second drill bit design parameter for the plurality of drill bit designs;
   based on the detected instances of backward whirl, determining a second correlation between the instances of backward whirl and the values of the second drill bit design parameter; and
   based on the second correlation, determining a set of one or more limits for the second drill bit design parameter that mitigates backward whirl;
   wherein generating the drill bit design rules is also based on the determined set of one or more limits for the second drill bit design parameter.

9. The method of claim 1, further comprising:
   determining a multi-dimensional design space to mitigate backward whirl, wherein determining the multi-dimensional design space comprises determining the set of one or more limits for the first drill bit design parameter and determining a set of one or more limits for a second drill bit design parameter.

10. A non-transitory, computer-readable medium having instructions stored thereon that are executable by a computing device, the instructions to:
    determine values for a first drill bit design parameter for a plurality of drill bit designs;
    detect instances of backward whirl based on vibrational data;
    determine a correlation between the instances of backward whirl and the values of the first drill bit design parameter, wherein the instructions to determine the correlation include instructions to determine a set of values for the first drill bit design parameter based on an aggregate of the values for the first drill bit design parameter identified for the instances of backward whirl;
    based on the correlation, determine a set of one or more limits for the first drill bit design parameter that mitigates backward whirl; and
    generate drill bit design rules based on the determined set of one or more limits for the first drill bit design parameter.

11. The non-transitory, computer-readable media of claim 10, wherein the instructions further comprise instructions to:
    validate a first drill bit design based on the generated drill bit design rules, wherein validation comprises instructions to determine that a value for the first drill bit design parameter for the drill bit design lies within the set of one or more limits for values of the first drill bit design parameter that mitigates backward whirl; and
    based on a determination that the first drill bit design is not valid, adjust the first drill bit design based on a difference between the value of the first drill bit design parameter of the first drill bit design and the set of one or more limits for values of the first drill bit design parameter that mitigates backward whirl.

12. The non-transitory, computer-readable media of claim 10, wherein instructions to detect backward whirl comprise instructions to detect lateral vibrations at a frequency equal to a difference between the bit rotational angular frequency ($\omega$) and the whirl frequency ($\Omega$).

13. The non-transitory, computer-readable media of claim 10, wherein instructions to detect instances of backward whirl comprise instructions to at least one of detect instances of cutting-induced backward whirl and detect instances of friction-induced backward whirl.

14. The non-transitory, computer-readable media of claim 10, wherein instructions to determine a set of one or more limits for the first drill bit design parameter comprises instructions to determine at least one of a limit that drilling efficiency should be more than 42%, a limit that whirl index should be less than 110%, and a limit that gauge fullness should be non-full.

15. The non-transitory, computer-readable media of claim 10, wherein the instructions further comprise instructions to:

determine values for a second drill bit design parameter for the plurality of drill bit designs;

based on the detected instances of backward whirl, determine a second correlation between the instances of backward whirl and the values of the second drill bit design parameter; and based on the second correlation, determine a set of one or more limits for the second drill bit design parameter that mitigates backward whirl;

wherein instructions to generate the drill bit design rules further comprise instruction to generate drill bit design rules also based on the determined set of one or more limits for the second drill bit design parameter.

16. The non-transitory, computer-readable media of claim 10, further comprising instructions to:

determine a multi-dimensional design space to mitigate backward whirl, wherein instructions to determine a multi-dimensional design space comprise instruction to determine the set of one or more limits for the first drill bit design parameters and determine a set of one or more limits for a second drill bit design parameter.

17. An apparatus comprising:

a processor; and a computer-readable medium having instructions stored thereon that are executable by the processor to cause the apparatus to, determine values for a first drill bit design parameter for a plurality of drill bit designs;

detect instances of backward whirl based on vibrational data;

determine a correlation between the instances of backward whirl and the values of the first drill bit design parameter, wherein the instructions to cause the apparatus to determine the correlation include instructions to cause the apparatus to determine a set of values for the first drill bit design parameter based on an aggregate of the values for the first drill bit design parameter identified for the instances of backward whirl;

based on the correlation, determine a set of one or more limits for the first drill bit design parameter that mitigates backward whirl; and generate drill bit design rules based on the determined set of one or more limits for the first drill bit design parameter.

18. The apparatus of claim 17, further comprising instructions to:

validate a first drill bit design based on the generated drill bit design rules, wherein validation comprises instructions to determine that a value for the first drill bit design parameter for the drill bit design lies within the set of one or more limits for values of the first drill bit design parameter that mitigates backward whirl; and based on a determination that the first drill bit design is not valid, adjust the first drill bit design based on a difference between the value of the first drill bit design parameter of the first drill bit design and the set of one or more limits for values of the first drill bit design parameter that mitigates backward whirl.

19. The apparatus of claim 17, wherein instructions to detect backward whirl comprises instruction to detect lateral vibrations at a frequency equal to a difference between the bit rotational angular frequency ($\omega$) and the whirl frequency ($\Omega$).

20. The apparatus of claim 17, further comprising instructions to:

determine values for a second drill bit design parameter for the plurality of drill bit designs;

based on the detected instances of backward whirl, determine a second correlation between the instances of backward whirl and the values of the second drill bit design parameter; and based on the second correlation, determine a set of one or more limits for the second drill bit design parameter that mitigates backward whirl;

wherein instructions to generate the drill bit design rules further comprise instruction to generate a multi-dimensional design space wherein backward whirl is mitigated based on the determined set of one or more limits for the first drill bit design parameters and the determined set of one or more limits for the second drill bit design parameter.

* * * * *